(12) United States Patent
Yoshikawa et al.

(10) Patent No.: US 6,291,369 B1
(45) Date of Patent: Sep. 18, 2001

(54) RESIN MOLDING

(75) Inventors: Masahiro Yoshikawa; Katsumi Kameda, both of Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/285,726

(22) Filed: Apr. 5, 1999

(30) Foreign Application Priority Data

| Apr. 8, 1998 | (JP) | 10-096317 |
| Feb. 26, 1999 | (JP) | 11-051403 |
| Feb. 26, 1999 | (JP) | 11-051418 |
| Mar. 8, 1999 | (JP) | 11-060788 |
| Mar. 8, 1999 | (JP) | 11-060810 |

(51) Int. Cl.$^7$ .............................. B32B 27/12; B32B 27/04
(52) U.S. Cl. .................. 442/58; 442/50; 442/52; 442/54; 442/117
(58) Field of Search ................ 442/5, 6, 16, 19, 442/43, 49, 117

(56) References Cited

U.S. PATENT DOCUMENTS 5,840,383 * 11/1998 Kotz et al. .......................... 428/35.8

FOREIGN PATENT DOCUMENTS

| 0 582 075 A1 | 2/1994 | (EP) . |
| 0 936 045 A1 | 8/1999 | (EP) . |
| 2 092 053 | 8/1982 | (GB) . |

OTHER PUBLICATIONS

Patent Abstracts of Japan, vol. 32, No. 5693 & JP 11 086786 A (Polyplastics), Jul. 9, 1999 Abstract.
Patent Abstracts of Japan, vol. 16, No. 8405 & JP 04 041216 A (Azuma Semitisu Kanagata) Feb. 12, 1992 Abstract.

* cited by examiner

Primary Examiner—Elizabeth M. Cole
Assistant Examiner—Ula C. Ruddock
(74) Attorney, Agent, or Firm—Parkhurst & Wendel, L.L.P

(57) ABSTRACT

A soft, meshed, electromagnetic shielding textile sheet is placed in a mold, and the mold is clamped. The soft, meshed electromagnetic shielding textile sheet is shaped so as to conform with the inner surface of the mold when the mold is clamped. Therefore, it is not necessary to fabricate beforehand any insert of a shape corresponding to that of the inner surface of the mold. Since the meshed, electromagnetic shielding textile sheet is impregnated with part of a resin injected into the mold to form an injection-molded resin body, the adhesion of the electromagnetic shielding textile sheet to the injection-molded resin body is improved.

23 Claims, 23 Drawing Sheets

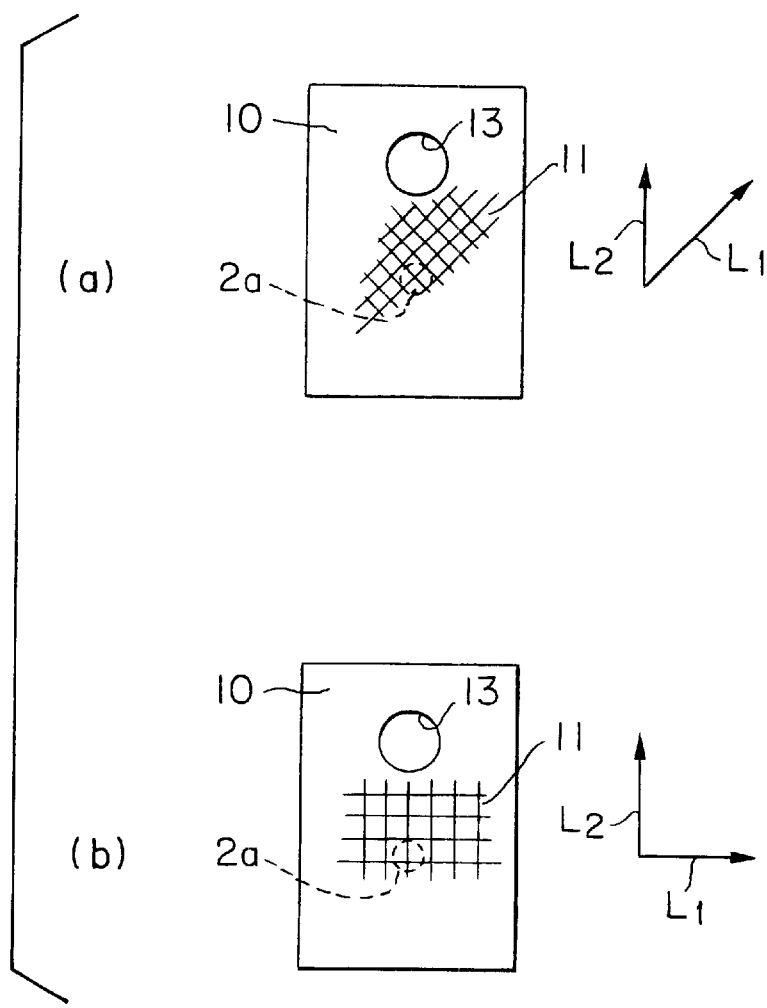
F I G. 9
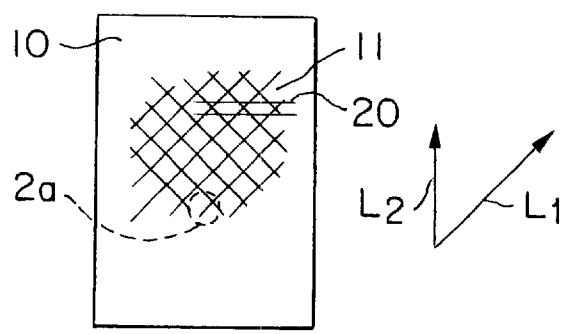
F I G. 10

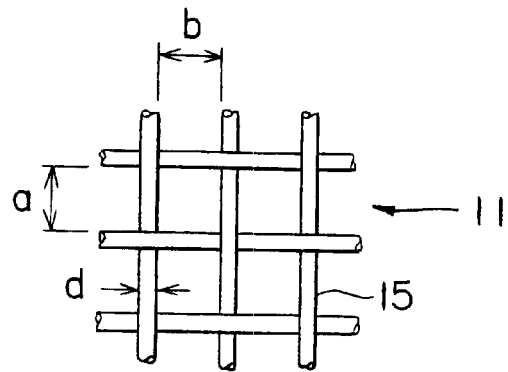
F I G. 14
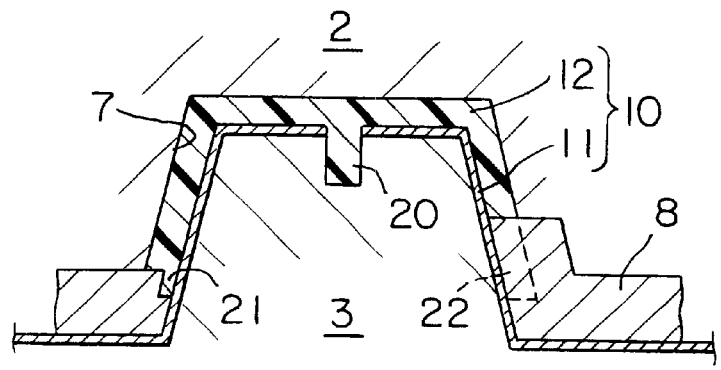
F I G. 15
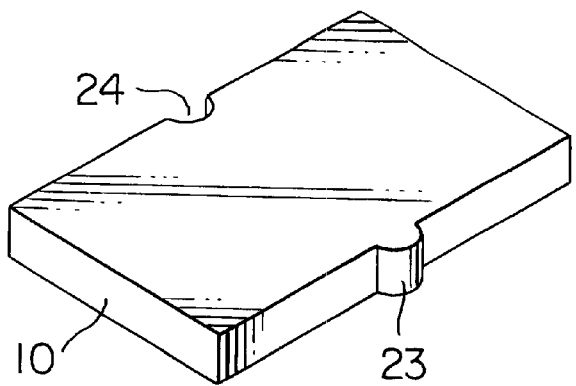
F I G. 16

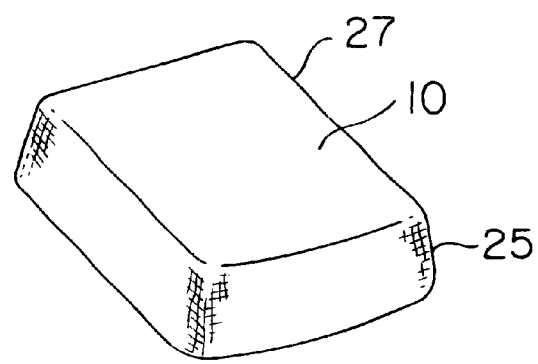
F I G. 19
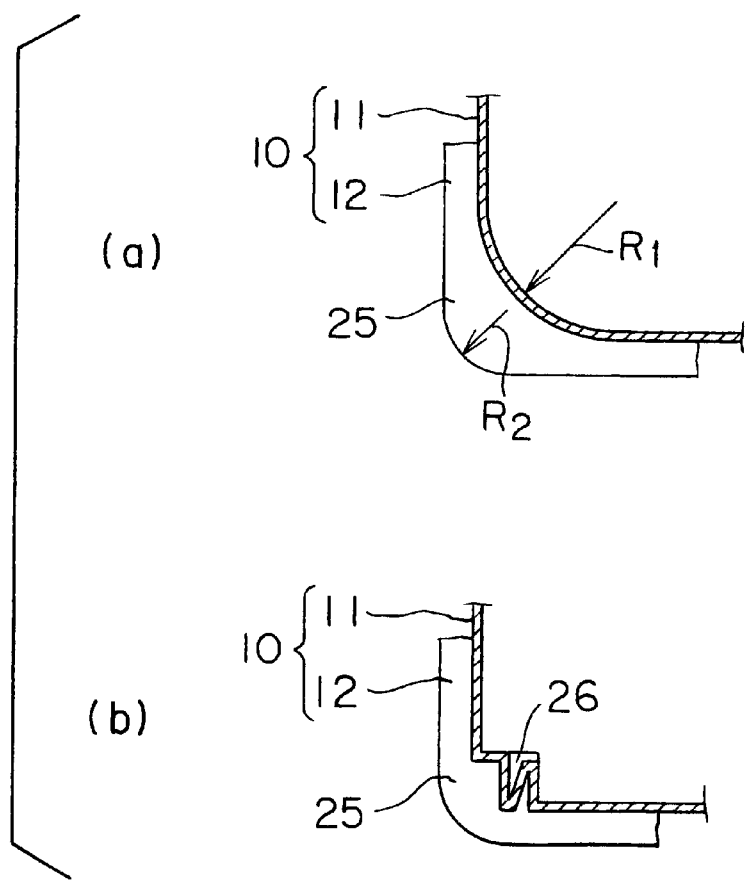
F I G. 20

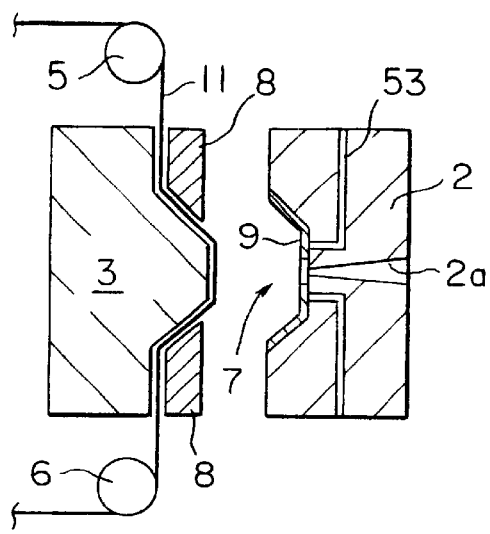
F I G. 21
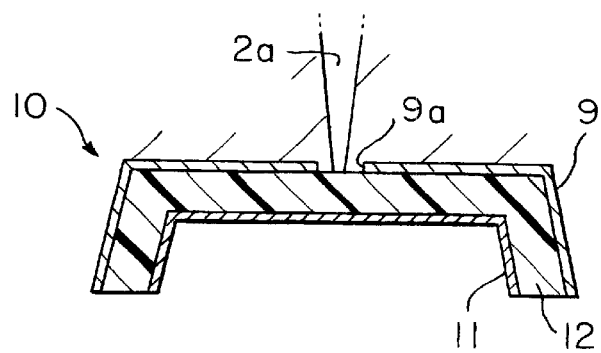
F I G. 22
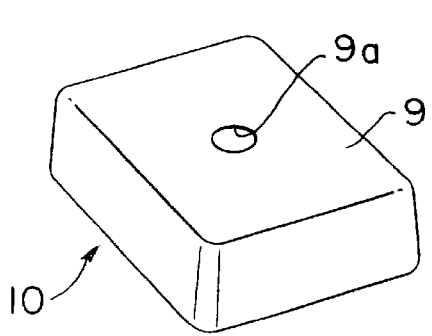
F I G. 23
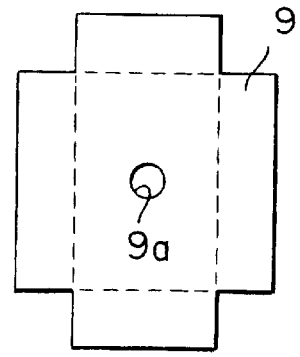
F I G. 24

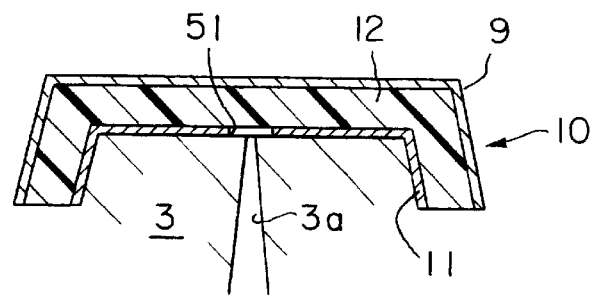
F I G. 25
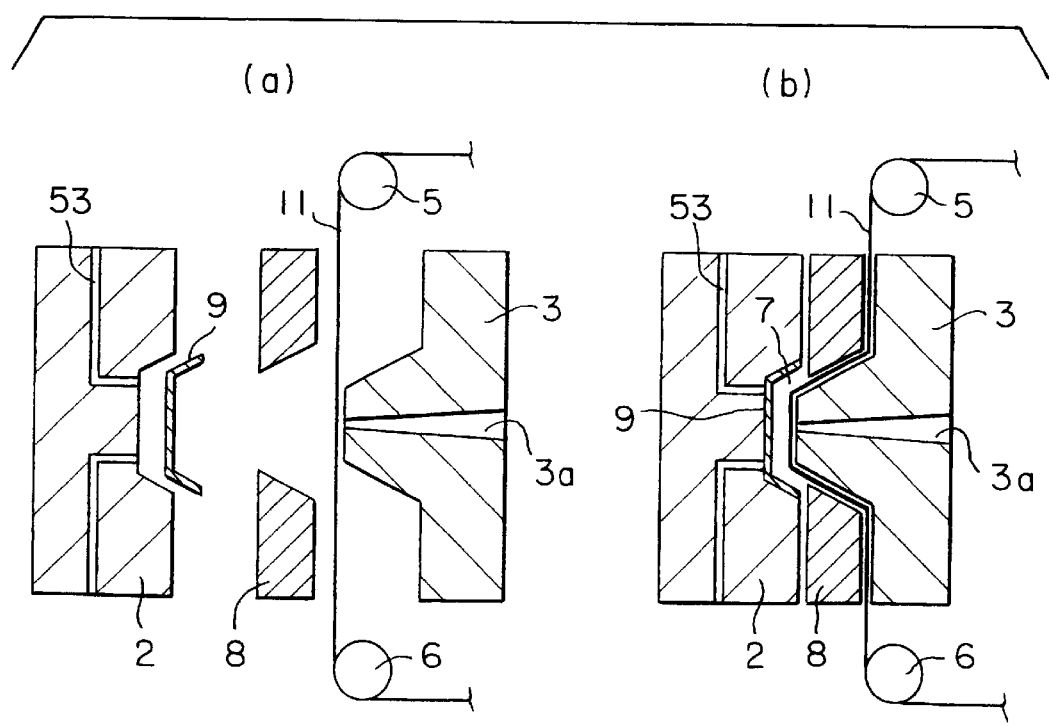
F I G. 26

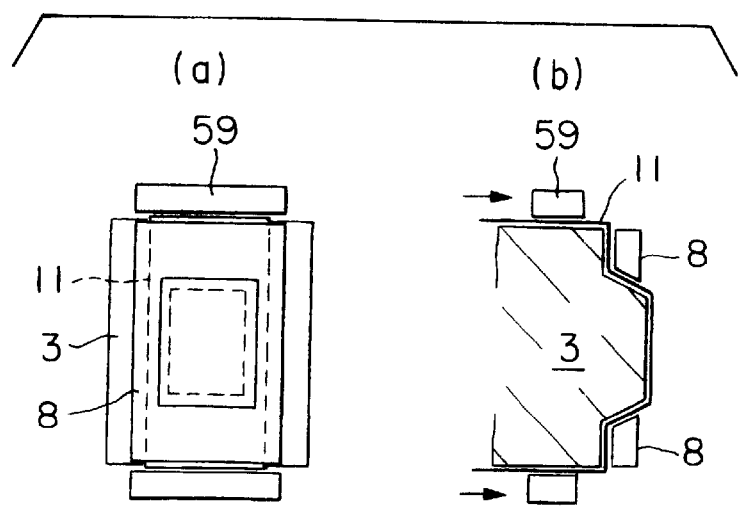
F I G. 36
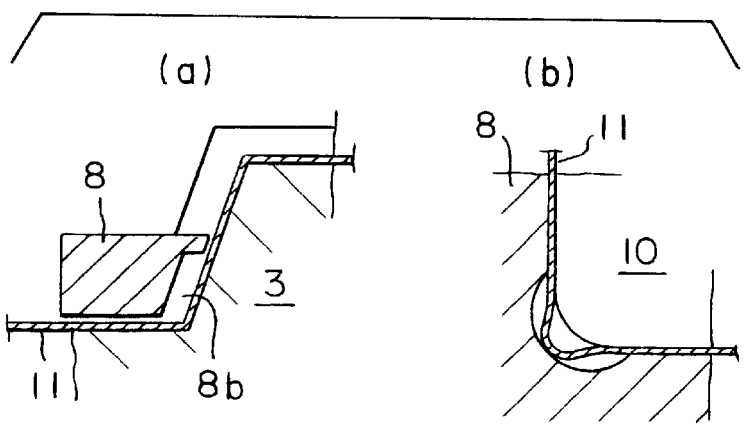
F I G. 37
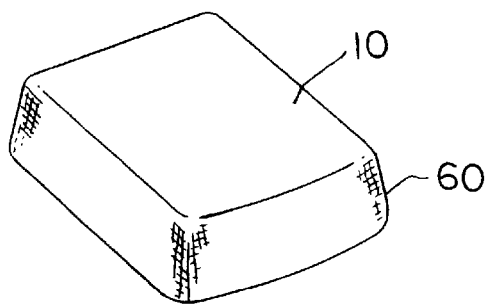
F I G. 38

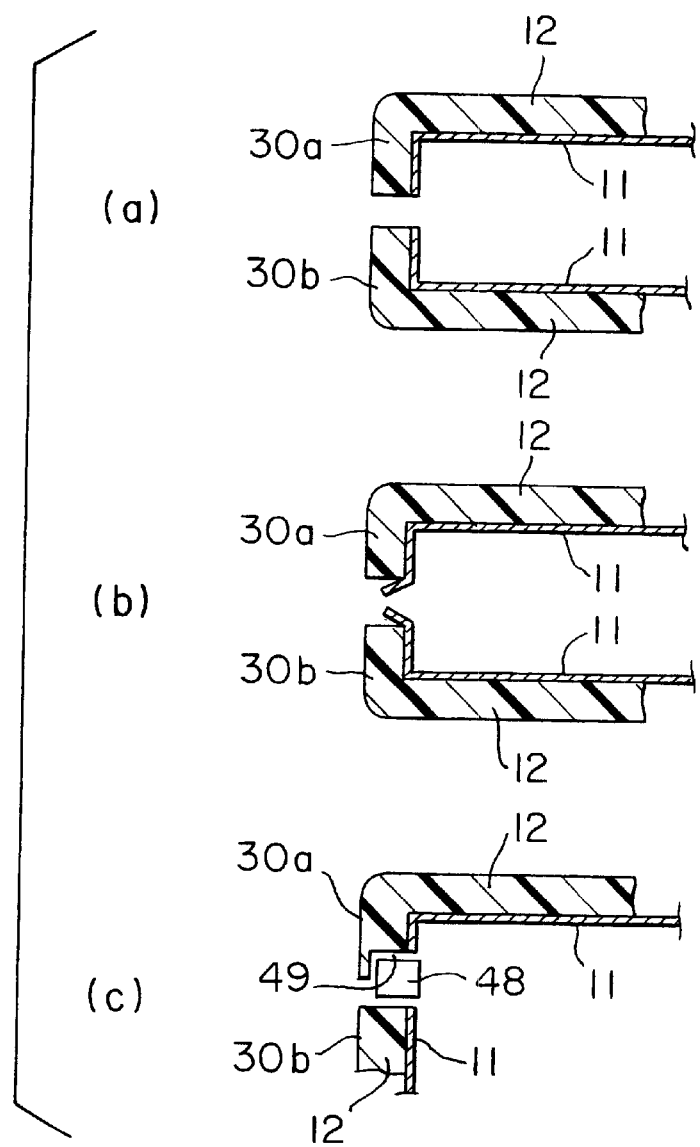
F I G. 50
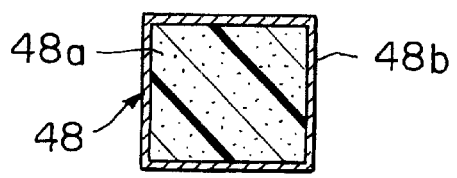
F I G. 51

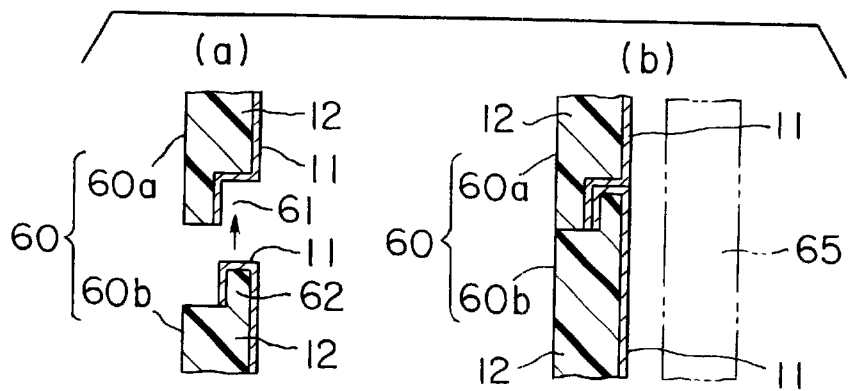
F I G. 53
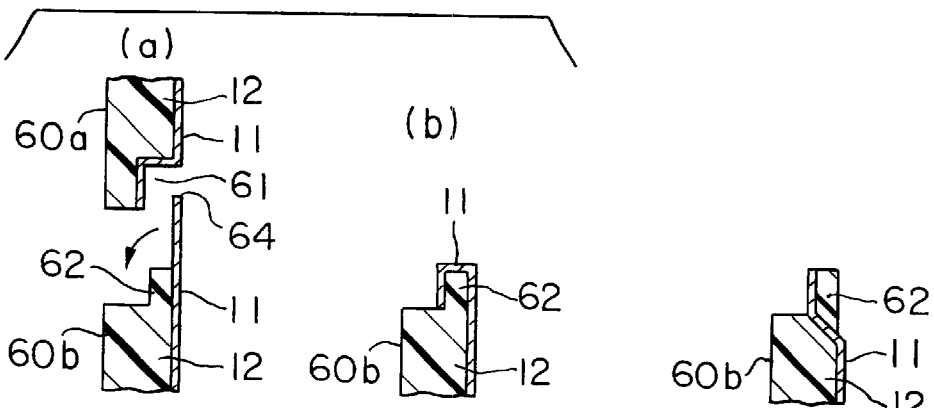
F I G. 54
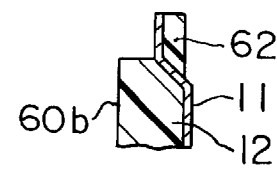
F I G. 55
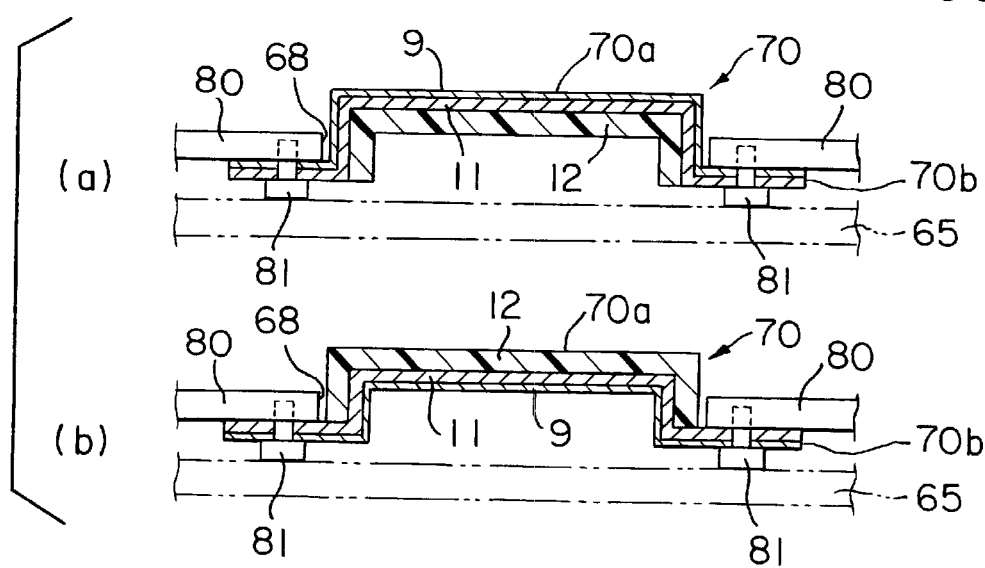
F I G. 56

RESIN MOLDING

TECHNICAL FIELD

The present invention relates to a resin molding, a method of manufacturing the same, an apparatus for carrying out the method, and a case. More particularly, the present invention relates to a resin molding integrally provided with an insert, a method of manufacturing the same, an apparatus for carrying out the method, and a case.

BACKGROUND ART

There are known resin moldings integrally provided with an insert. Such a resin molding is formed by placing an insert of a shape corresponding to that of the resin molding in a mold, and injecting a molten resin into the mold.

When manufacturing such a resin molding integrally provided with an insert, the insert of a shape corresponding to that of the resin molding needs to be placed in a mold. Since the insert must be disposed at a predetermined position in the mold, the freedom of molding work is restricted.

DISCLOSURE OF THE INVENTION

The present invention has been made in view of such a problem and it is therefore an object of the present invention to provide a resin molding capable of greatly enhancing the freedom of molding work, a method of manufacturing such a resin molding, a manufacturing apparatus for carrying out the method, and a case.

According to the present invention, a resin molding comprises an injection-molded resin body, and a soft meshed member combined with the injection-molded resin body.

The resin molding may further comprise a decorative member bonded to the injection-molded resin body.

According to the present invention, a resin molding manufacturing method comprises the steps of placing a meshed member in an open mold, clamping the mold, and injecting a resin into the mold.

According to the present invention, a resin molding manufacturing method comprises the steps of placing a decorative member and a soft meshed member in a cavity formed between a male mold and a female mold, and injecting a resin into the cavity to form an injection-molded resin body.

According to the present invention, a resin molding manufacturing apparatus for manufacturing a resin molding comprises a male mold, and a female mold to be combined with the male mold to form a cavity in which a soft meshed member is placed, wherein the female mold is provided with a protrusible member capable of being protruded toward the male mold.

According to the present invention, a resin molding manufacturing apparatus for manufacturing a resin molding comprises a male mold, a female mold to be combined with the male mold to form a cavity in which a soft meshed member is placed, and a stripper interposed between the male and the female mold and capable of holding a peripheral part of the soft meshed member, lying on the brim of the cavity together with the male mold.

According to the present invention, a case comprising a first half case, and a second half case joined to the first half case so as to form a space for containing an electronic circuit, wherein each of the first and the second half case comprises an injection-molded resin body and an electromagnetic shielding textile sheet covering the inner surface of the injection-molded resin body.

According to the present invention, a case comprising a first half case, and a second half case joined to the first half case so as to form a space for containing an electronic circuit, wherein each of the first and the second half case comprises an injection-molded resin body and an electromagnetic shielding textile sheet covering the inner surface of the injection-molded resin body, the first half case is provided with a recess, and the second half case is provided with a protrusion fitting the recess of the first half case.

According to the present invention, a resin molding to be fixed to a case containing an electric circuit so as to cover an opening formed in the case comprises a main part covering the opening of the case, and a peripheral part formed around the main part so as to be in contact with the inner surface of the case, wherein the main part comprises an injection-molded resin body, a decorative member bonded to the injection-molded resin body, and a soft meshed member combined with the injection-molded resin body, and the meshed member of the main part has a part extending through the peripheral part.

BRIEF DESCRIPTION OF THE DRAWINGS

FIG. 9 is a view of a modification of the resin molding in accordance with the present invention;

FIG. 10 is a view of a modification of the resin molding in accordance with the present invention;

FIG. 14 is a view of an electromagnetic shielding textile sheet;

FIG. 15 is a view of a modification of the resin molding in accordance with the present invention;

FIG. 16 is a view of a modification of the resin molding in accordance with the present invention;

FIG. 19 is a view of a modification of the resin molding in accordance with the present invention;

FIG. 20 is a view of a modification of the resin molding in accordance with the present invention;

FIG. 21 is a schematic view of a mold employed in a method of manufacturing a resin molding in a third embodiment according to the present invention in a state where a male mold and a female mold are separated from each other;

FIG. 22 is a sectional view of a molding in accordance with the present invention;

FIG. 23 is a perspective view of a resin molding in accordance with the present invention;

FIG. 24 is a plan view of a decorative member;

FIG. 25 is a modification of the resin molding in accordance with the present invention;

FIG. 26 is a modification of the resin molding manufacturing method in accordance with the present invention;

FIG. 36 is a view of a modification of the resin molding manufacturing apparatus in accordance with the present invention;

FIG. 37 is a view of a modification of a resin molding manufacturing apparatus in accordance with the present invention;

FIG. 38 is a perspective view of a resin molding having corners;

FIG. 50 is a view of a joint of half cases;

FIG. 51 is a sectional view of a gasket;

FIG. 53 is a view of a case in a sixth embodiment according to the present invention;

FIG. 54 is a view of assistance in explaining a case manufacturing process;

FIG. 55 is a view of a modification of the case; and

FIG. 56 is a view of a cover for covering an opening formed in a case.

BEST MODE FOR CARRYING OUT THE INVENTION

First Embodiment

A first embodiment of the present invention will be described hereinafter with reference to the accompanying drawings.

Figure 1:
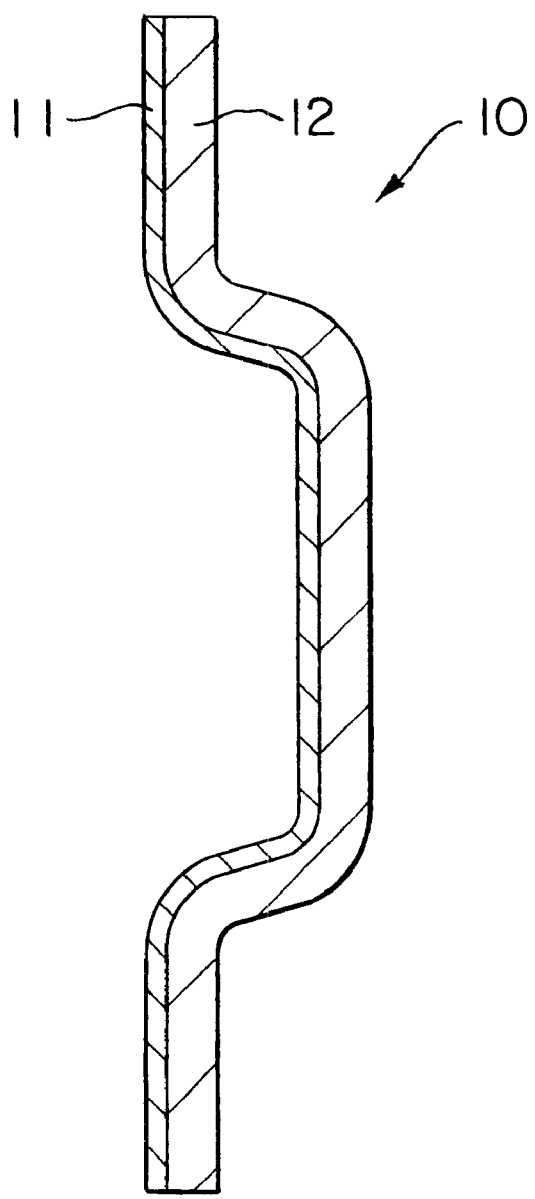
FIG. 1 is a sectional view of a resin molding in a first embodiment according to the present invention.

FIGS. 1 to 4 are views of assistance in explaining a resin molding in accordance with the present invention and a method of manufacturing the same. Referring to FIG. 1, a resin molding 10 has an injection-molded resin body 12, and a soft electromagnetic shielding textile sheet (meshed member) 11 bonded to one surface of the injection-molded resin body 12. The electromagnetic shielding textile sheet 11 is an insert for electromagnetic shielding. The electromagnetic shielding textile sheet 11 is a meshed textile sheet having meshes 16 and formed by interlacing a plurality of linear elements 15 as shown in FIGS. 4(a) and 4(b).

Each linear element 15 is formed by coating a core member 15a of a synthetic resin, such as a polyester resin or a nylon resin, with a metal layer 15b. The metal layer 15b is formed by depositing copper or nickel on the surface of the core member 15a by electroless plating. The linear element 15 may comprise a glass core 15a and a metal layer 15b coating the glass core 15a or may be only a metal core.

The injection-molded resin body 12 may be formed of a general-purpose thermoplastic resin, such as a PC resin, a HIPS resin, a PS resin, a PP resin, a PE resin, an ABS resin, a PVC resin, a nylon resin or an AS resin.

A transparent resin molding 10 having an excellent electromagnetic shielding characteristic can be formed by combining a transparent injection-molded resin body 12 and an electromagnetic shielding textile sheet 11 having a desired light transmittance.

A method of manufacturing the resin molding will be described below.

Figure 2:
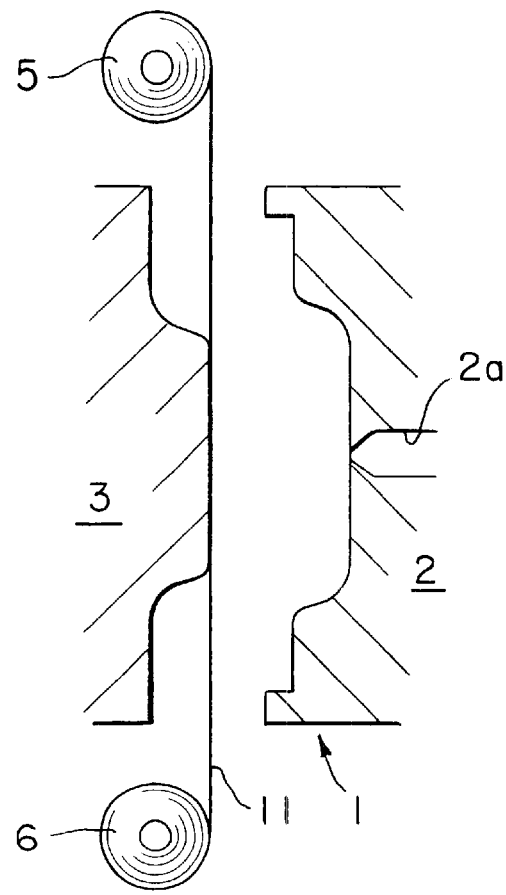
FIG. 2 is a schematic view showing a molding employed in a resin molding manufacturing method in accordance with the present invention in an open state.

Referring to FIG. 2, a mold 1 having a fixed mold 2 provided with a gate 2a, and a movable mold 3 is used. The mold 1 is opened by separating the movable mold 3 from the fixed mold 2, an electromagnetic shielding textile sheet 11 is unwound from a feed roll 5, and the electromagnetic shielding textile sheet 11 is extended through a space between the fixed mold 2 and the movable mold 3 (in a cavity 7 of the mold 1).

The electromagnetic shielding textile sheet 11 extended through the cavity 7 of the mold 1 is held in a slack state or in a moderately tensioned between the feed roll 5 and a take-up roll 6.

Figure 3:
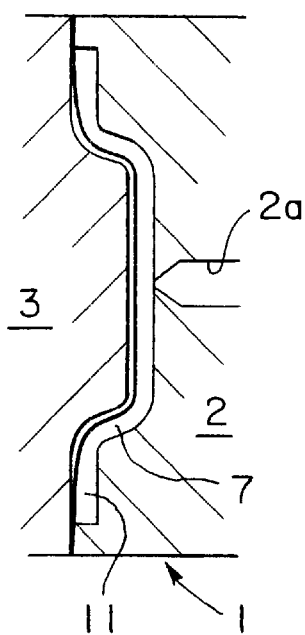
FIG. 3 is a schematic view showing the molding employed in the resin molding manufacturing method in accordance with the present invention in a closed state.
Figure 4:
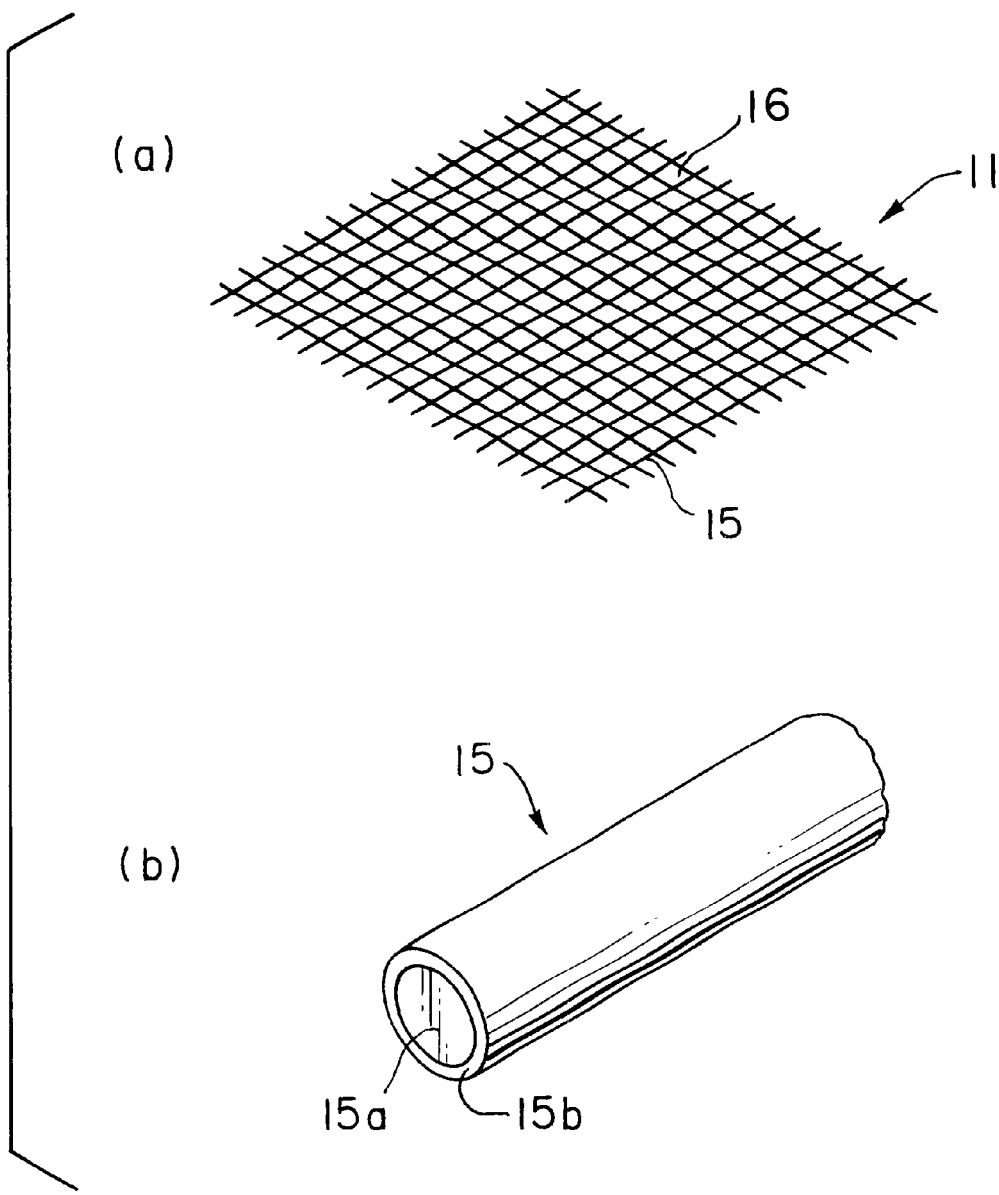
FIG. 4 is a perspective view of an electromagnetic shielding textile sheet.

As shown in FIG. 3, the movable mold 3 is moved toward the fixed mold 2, the fixed mold 2 and the movable mold 3 are clamped together (the mold is closed).

Since the electromagnetic shielding textile sheet 11 extended through the cavity 7 of the mold 1 is soft and slack or moderately tensioned, the electromagnetic shielding textile sheet 11 is formed in a shape corresponding to the shape of the cavity 7 defined by the fixed mold 2 and the movable mold 3. Thus, the electromagnetic shielding textile sheet 11 formed in a desired shape can be disposed at a predetermined position in the cavity 7.

When the fixed mold 2 and the movable mold 3 are thus clamped together, parts of the electromagnetic shielding textile sheet 11 extending above and below the cavity 7 are sandwiched between the fixed mold 2 and the movable mold 3.

A resin is injected through the gate 2a of the fixed mold 2 into the cavity 7. Consequently, the electromagnetic shielding textile sheet 11 is pressed against the movable mold 3 by the resin injected into the cavity 7.

Since the electromagnetic shielding textile sheet 11 is meshed, the electromagnetic shielding textile sheet 11 has moderate irregularities in its surfaces. Accordingly, the irregularities of the electromagnetic shielding textile sheet 11 are embedded in an injection-molded resin body 12, so that the adhesion of the electromagnetic shielding textile sheet 11 to the injection-molded resin body 12 is improved. Part of the resin forming the injection-molded resin body 12 flows through the meshes of the electromagnetic shielding textile sheet 11 toward the movable mold 3 because the electromagnetic shielding textile sheet 11 is meshed. Therefore, the resin injected into the cavity 7 can spread satisfactorily throughout the cavity 7 even if the cavity 7 has a complicated shape. If a film impenetrable to the resin is placed in the cavity 7 of the mold 1, the resin cannot spread satisfactorily throughout the cavity 7. Thus, the use of the electromagnetic shielding textile sheet 11 enhances the freedom of the shape of the resin molding.

Thus, the resin molding 10 is formed in the cavity 7 of the mold 1. After completing the molding step, a part of the electromagnetic shielding textile sheet 11 included in the resin molding 10 is cut off the electromagnetic shielding textile sheet 11 by a cutter, not shown, and a scrap of the electromagnetic shielding textile sheet 11 is taken up by the take-up roll 6.

The resin molding 10 capable of electromagnetic shielding can easily and simply be manufactured.

Although the resin molding 10 in this embodiment is provided with an electromagnetic shielding textile sheet 11 as the meshed member, a nonwoven fabric of synthetic resin fibers or a porous synthetic resin film may be used instead of the electromagnetic shielding textile sheet 11.

The electromagnetic shielding textile sheet 11 may be cut in a shape corresponding to that of the resin molding 10 before forming the resin molding 10 with cutting tools mounted on the fixed mold 2 and the movable mold 3 when the fixed mold 2 and the movable mold 3 are clamped together instead of cutting the same in such a shape after the resin molding 10 has been molded.

EXAMPLES

Examples of the present invention will be described below.

A case (the resin molding 10) was provided with a electromagnetic shielding textile sheet 11. The electromagnetic shielding textile sheet 11 can be formed of linear elements 15 formed by coating polyester cores 15a with a metal layer 15b of nickel and copper by electroless plating.

The electromagnetic shielding textile sheet 11 was placed in the mold 11, and a resin was injected into the cavity 7 of the mold 1 to form a resin molding 10 having, in combination, the electromagnetic shielding textile sheet 11 and an injection-molded resin body 12.

Concrete manufacturing conditions were as follows.

The mold 1 has a cavity of a shape corresponding to that of a box-shaped resin molding 10 of 100 mm×100 mm×15 mm.

A molding machine of 350 t in mold clamping ability (J350EPU, commercially available from Nippon Seikosho K.K.) was used. An upper part of an electromagnetic shielding textile sheet 11 of 150 mm×300 mm was fixed to an upper part of a movable mold 3 with a lower part of the same left free.

The following three resins were used.

Polycarbonate resin (PC)

High-impact polystyrene resin (HIPS)

Heat-resistant polypropylene resin (Heat-resistant PP)

The properties of the resin molding 10 will be described below.

A molding process for molding the resin molding 10 was not affected adversely by the electromagnetic shielding textile sheet 11 and the resin molding 10 was molded entirely similarly to ordinary resin moldings. It was known from the microscopic observation of the resin molding 10 that the electromagnetic shielding textile sheet 11 is impregnated with the resin forming the resin body 12, and the electromagnetic shielding textile sheet 11 and the resin body 12 were firmly locked together.

The conformance of the electromagnetic shielding textile sheet 11 with the resin molding 10 of 15 mm in depth was satisfactory, and the electromagnetic shielding textile sheet 11 conformed substantially perfectly with the resin molding 10 when there is no particular obstacles. The electromagnetic shielding textile sheet 11 was not damaged when injection pressure and temperature were varied.

According to the present invention, a soft, meshed member can be shaped so as to conform with the inner surface of a mold when clamping the mold. Therefore, it is not necessary to fabricate beforehand an insert member of a shape corresponding to the shape of the cavity of the mold. Since the resin body and the meshed member can firmly be locked together, it is not necessary to bond the resin body and the meshed member together with an adhesive or the like.

Second Embodiment

A second embodiment of the present invention will be described hereinafter with reference to the accompanying drawings.

Figure 5:
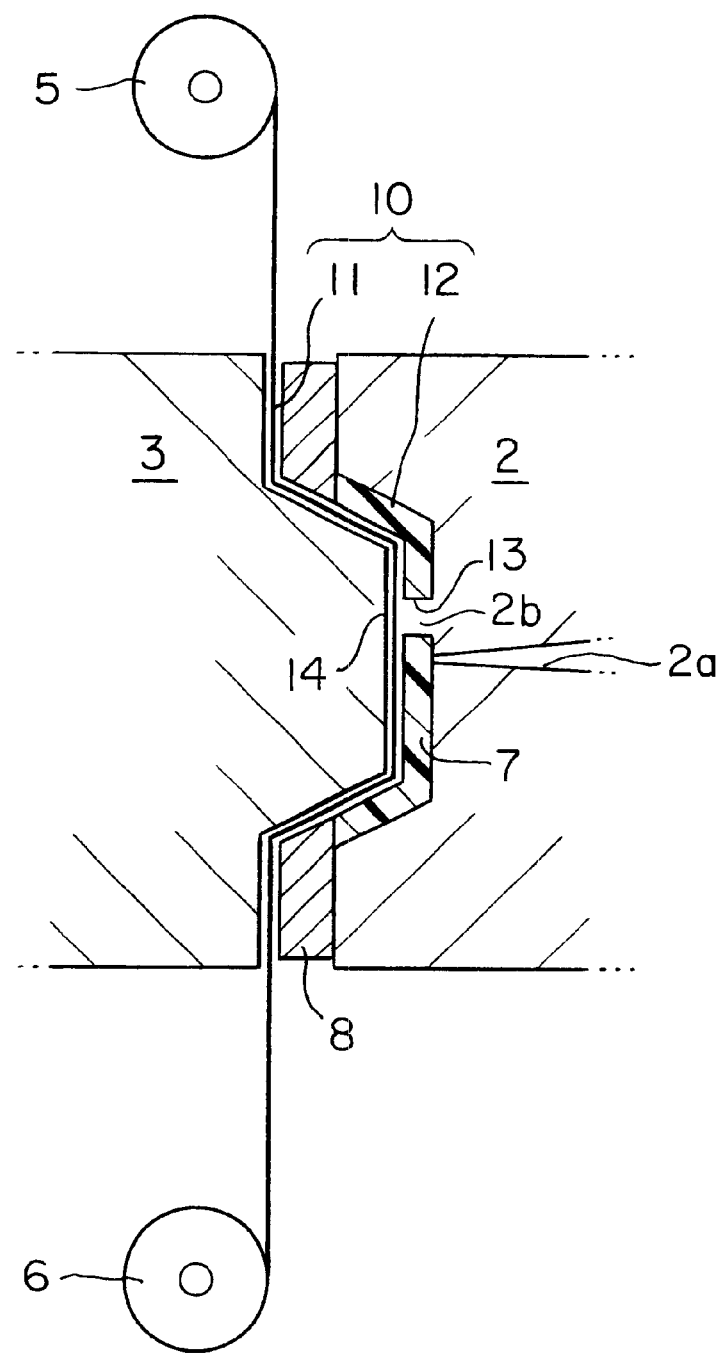
FIG. 5 is a sectional view of a resin molding in a second embodiment according to the present invention.

FIGS. 5 to 10 are views of assistance in explaining a resin molding in accordance with the present invention and a resin molding manufacturing apparatus for manufacturing the same. Referring to FIG. 5, a resin molding 10 has an injection-molded resin body 12, and a soft electromagnetic shielding textile sheet (meshed member) 11 bonded to one surface of the injection-molded resin body 12. The electromagnetic shielding textile sheet 11 is an insert for electromagnetic shielding. The electromagnetic shielding textile sheet 11 is a meshed textile sheet having meshes 16 and formed by interlacing a plurality of linear elements 15 as shown in FIGS. 4(a) and 4(b).

Each linear element 15 is formed by coating a core member 15a of a synthetic resin, such as a polyester resin or a nylon resin, with a metal layer 15b. The metal layer 15b is formed by depositing copper or nickel on the surface of the core member 15a by electroless plating. The linear element 15 may comprise a glass core 15a and a metal layer 15b coating the glass core 15a or may be only a metal core.

As shown in FIG. 5, the injection-molded resin body 12 is provided with a through hole 13 covered with the electromagnetic shielding textile sheet 11. The electromagnetic shielding textile sheet 11 may be provided with a through hole 14 coinciding with the through hole 13 of the injection-molded resin body 12.

The injection-molded resin body 12 may be formed of a general-purpose thermoplastic resin, such as a PC resin, a HIPS resin, a PS resin, a PP resin, a PE resin, an ABS resin, a PVC resin, a nylon resin or an AS resin.

The resin molding 10 having an excellent electromagnetic shielding characteristic and an excellent transparency can be formed by combining a transparent injection-molded resin body 12 and an electromagnetic shielding textile sheet 11 having a desired light transmittance.

A resin molding manufacturing apparatus will be described below. Referring to FIG. 5, the resin molding manufacturing apparatus uses a mold 1 having a female mold 2 provided with a gate 2a, and a male mold 3 to be joined to the female mold 2 to define a cavity 7. An electromagnetic shielding textile sheet 11 is placed in the cavity 7.

A stripper 8 is disposed between the female mold 2 and the male mold 3. The electromagnetic shielding textile sheet 11 is held between the stripper 8 and the male mold 3.

The female mold 2 is provided with a protrusible member 2b capable of being protruded toward the male mold 3 to form the through hole 13 in the injection-molded resin body 12.

A method of manufacturing the resin molding will be described below.

The female mold 2 and the male mold 3 are separated from each other and an electromagnetic shielding textile sheet 11 is unwound from a feed roll 5, and the electromagnetic shielding textile sheet 11 is extended through the cavity 7.

The electromagnetic shielding textile sheet 11 extended through the cavity 7 of the mold 1 is held in a moderately tensioned state between the feed roll 5 and a take-up roll 6.

Then, the stripper 8 is moved toward the male mold 3 to hold the electromagnetic shielding textile sheet 11 between the male mold 3 and the stripper 8.

Since the electromagnetic shielding textile sheet 11 is soft and is extended in a moderately tensioned state between the feed roll 5 and the take-up roll 6, the electromagnetic shielding textile sheet 11 can be shaped without being creased so as to conform with the shape of the surface of the male mold 3. Thus, the electromagnetic shielding textile sheet 11 formed in a desired shape can be disposed at a predetermined position on the surface of the male mold 3.

Then, the male mold 3 and the female mold 2 are clamped together, and a resin is injected through the gate 2a of the female mold 2 into the cavity 7. Thus, an injection-molded resin body 12 is molded, and the electromagnetic shielding textile sheet 11 is combined with the resin body 12.

Since the electromagnetic shielding textile sheet 11 is porous, the electromagnetic shielding textile sheet 11 has moderate irregularities in its surfaces. Accordingly, the irregularities of the electromagnetic shielding textile sheet 11 are embedded in the injection-molded resin body 12, so that the adhesion of the electromagnetic shielding textile sheet 11 to the injection-molded resin body 12 is improved.

Thus, the resin molding 10 is formed in the cavity 7. The through hole 13 is formed in the injection-molded resin body 12 by the protrusible member 2b. After completing the molding step, a part of the electromagnetic shielding textile sheet 11 included in the resin molding 10 is cut off the electromagnetic shielding textile sheet 11 by a cutter, not shown, and a scrap of the electromagnetic shielding textile sheet 11 is taken up by the take-up roll 6.

The resin molding 10 capable of electromagnetic shielding and provided with the through hole 13 can easily and simply be manufactured.

Although the resin molding 10 in this embodiment is provided with the electromagnetic shielding textile sheet 11 as the meshed member, a nonwoven fabric of synthetic resin fibers or a porous synthetic resin film may be used instead of the electromagnetic shielding textile sheet 11.

The electromagnetic shielding textile sheet 11 included in the resin molding 10 may be cut in a shape corresponding to that of the resin molding before forming the resin molding 10 with a cutting tool mounted on the stripper 8 when the stripper 8 is pressed against the male mold 3 instead of cutting the same in such a shape after the resin molding 10 has been molded.

The electromagnetic shielding textile sheet 11 may be provided with a through hole 14 coinciding with the through hole 13 of the injection-molded resin body 12.

Modifications of the present invention will be described hereinafter with reference to FIGS. 6 and 7. In a modification shown in FIG. 6, a protrusible member 2b is placed for sliding movement in a recess 17 formed in a female mold 2 and is pressed toward a male mold 3 by a spring 18. The modification shown in FIG. 6 is substantially the same in other respects as the embodiment shown in FIG. 5.

Figure 6:
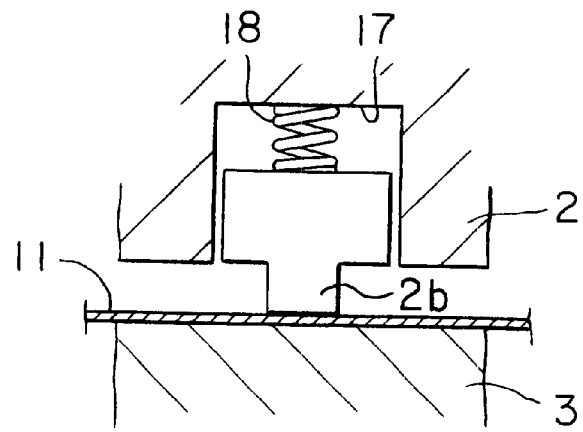
FIG. 6 is a view of a modification of the resin molding in accordance with the present invention.
Figure 7:
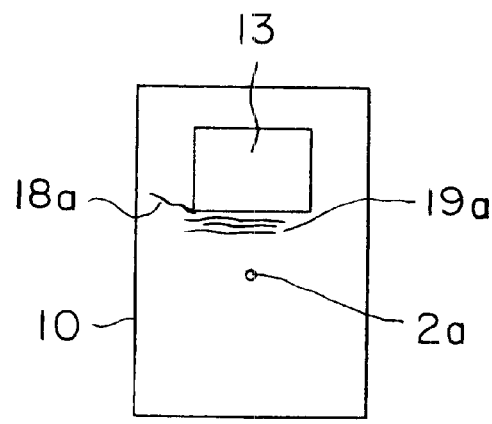
FIG. 7 is a view of a modification of the resin molding in accordance with the present invention.

Referring to FIG. 6, an electromagnetic shielding textile sheet 11 is pressed resiliently by the protrusible member 2b when the female mold 2 and the male mold 3 are clamped together. Therefore, the electromagnetic shielding textile sheet 11 can be made to slide on the protrusible member 2b by injection pressure when a resin is injected into the cavity to mold the injection-molded resin body 12, and hence any breakages, such as a breakage 18a shown in FIG. 7, and any creases, such as creases 19a shown in FIG. 7, are not formed around the through hole 13 of the electromagnetic shielding textile sheet 11.

The difference between the thickness of the electromagnetic shielding textile sheet 11 and a standard thickness thereof can be absorbed by the spring 18.

Figure 8:
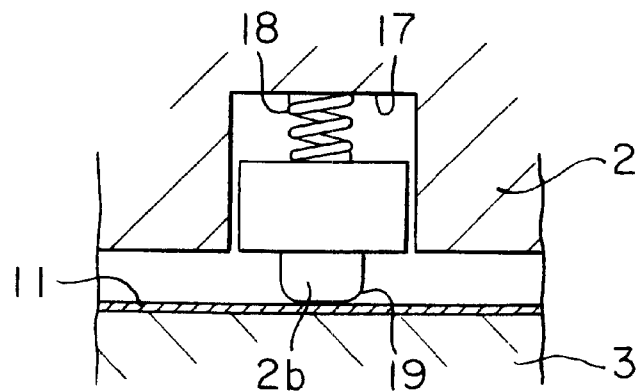
FIG. 8 is a view of a modification of the resin molding in accordance with the present invention.

The edge 19 of an end surface on the side of the male mold 3 of the protrusible member 2b placed in the recess 17 and pressed by the spring 18 may be rounded as shown in FIG. 8.

The protrusible member 2b having the end surface with the rounded edge 19 enables the effective sliding of the electromagnetic shielding textile sheet 11 relative to the protrusible member 2b.

A hydraulic cylinder actuator, a pneumatic cylinder actuator or the like may be used instead of the spring 18 for pressing the protrusible member 2b.

Generally, the meshes of the electromagnetic shielding textile sheet 11 of the resin molding 10 are arranged in rows parallel to a predetermined grain direction $L_1$. If the grain direction $L_1$ is inclined to an injecting direction $L_2$, the electromagnetic shielding textile sheet 11 can easily be stretched in the injecting direction $L_2$, which is effective in preventing the breakage and creasing of the electromagnetic shielding textile sheet 11 (FIG. 9(a). If the grain direction $L_1$ and the injecting direction $L_2$ are perpendicular to each other (FIG. 9(b)), it is difficult to stretch the electromagnetic shielding textile sheet 11 in the injecting direction $L_2$. In FIGS. 9(a) and 9(b), the injecting direction $L_2$ is substantially parallel to a straight line connecting the gate 2a and the through hole 13.

A resin molding 10 shown in FIG. 10 is provided with a rib 20 and has an electromagnetic shielding textile sheet 11 having meshes arranged in rows parallel to a grain direction $L_1$ inclined to an injecting direction $L_2$. This electromagnetic shielding textile sheet 11 can easily be stretched in the injecting direction $L_2$.

Figure 11:
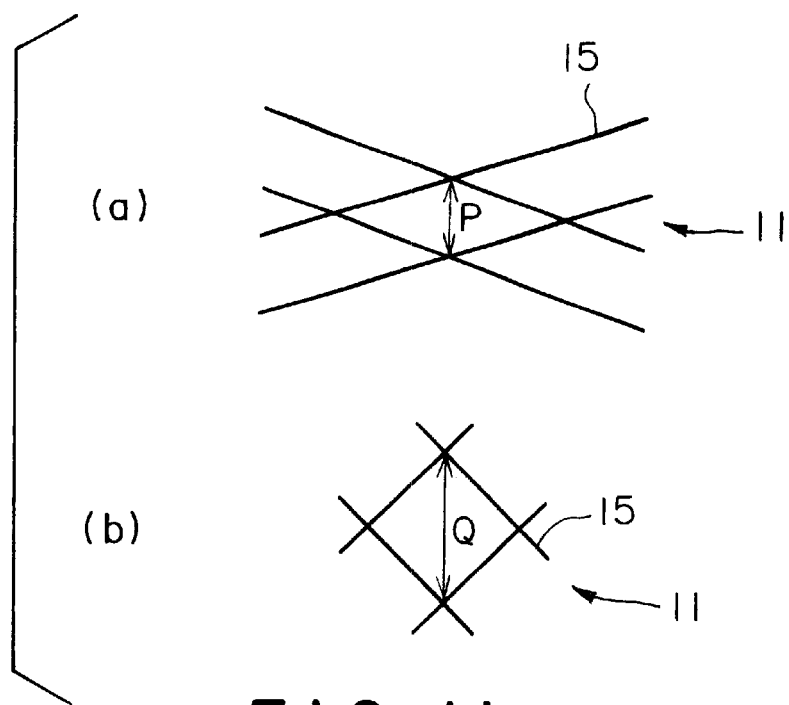
FIG. 11 is a view of an electromagnetic shielding textile sheet.

Referring to FIGS. 11(a) and 11(b), the elongation of an electromagnetic shielding textile sheet 11 is dependent on the ratio: Q/P, where P is the distance between the intersections of linear elements 15 when the electromagnetic shielding textile sheet 11 is in an initial state, and Q is the distance between the same intersections when the electromagnetic shielding textile sheet 11 is deformed so that the angle between the intersecting linear elements 15 is 90°. The elongation can be increased by inclining the grain direction $L_1$ relative to the injecting direction $L_2$.

Another modification of the present invention will be described with reference to FIGS. 12 to 14.

Figure 12:
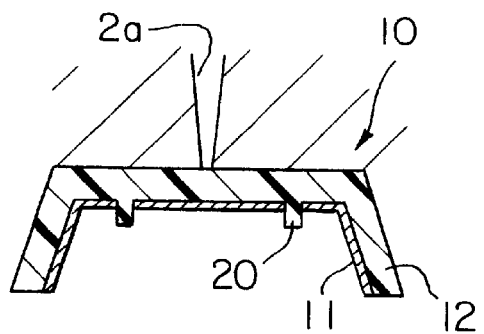
FIG. 12 is a view of a modification of the resin molding in accordance with the present invention.
Figure 13:
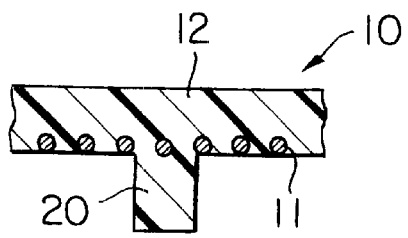
FIG. 13 is a view of a modification of the resin molding in accordance with the present invention.

A resin molding 10 in a modification shown in FIGS. 12 to 14 has an electromagnetic shielding textile sheet 11, and an injection-molded resin body 12 provided with ribs 20 on its surface on the side of the electromagnetic shielding textile sheet 11, and the electromagnetic shielding textile sheet 11 has meshes 16 of 0.04 mm² or above in area. The resin molding shown in FIGS. 12 to 14 is substantially the same in other respects as the resin molding 10 shown in FIG. 5.

Referring to FIGS. 12 to 14, suppose that d is the diameter of the linear elements 15, and a×b is the area of each mesh, and (a×b)/{(a+d)×(b+d)} is opening ratio. Then, the ribs 20 can be formed through the electromagnetic shielding textile sheet 11 without breaking the electromagnetic shielding textile sheet 11 by the injection-molded resin body 12 when ① the diameter is 50 μm, the opening ratio is 64% and the area of each mesh is 0.04 mm² or when ② the diameter is 300 μm, the opening ratio is 45% and the area of each mesh is 0.37 mm².

The resin molding 10 has external dimensions of 150 mm×100 mm×20 mm, and a thickness of 1.5 mm. The rib has a width of 1.5 mm, a height of 3 mm and a length in the range of 20 to 150 mm.

The ribs 20 can surely be formed through the electromagnetic shielding textile sheet 11 without breaking the electromagnetic shielding textile sheet 11 when the diameter d of the linear elements 15 is 40 μm or above, the opening ratio is 40% or above and the area of each mesh is 0.04 mm².

Bosses of a diameter in the range of 2.6 to 5.6 mm and a height of 3 mm can surely be formed as well as the ribs 20 on the injection-molded resin body 12.

Further modifications of the invention will be described with reference to FIGS. 15 and 16. Resin moldings 10 in modifications shown in FIGS. 15 and 16 have an elastic electromagnetic shielding textile sheet 11. The resin molding 10 in the modification is provided with a rib 20 and has side walls provided with a projection 21 and a recess 22 as shown in FIG. 15. The resin molding 10 in another modification is provided with a curved protrusion 23 in one of the side surfaces and a curved recess 24 in the other side surface as shown in FIG. 16. The resin moldings 10 shown in FIGS. 15 and 16 are substantially the same in other respects as the embodiment shown in FIG. 5.

The projection 21 of one of a pair of resin moldings 10 of a shape like that of the resin molding 10 shown in FIG. 15 is fitted in the recess 22 of the other one of the pair of resin moldings 10. The curved protrusion 23 of one of a pair of resin moldings 10 of a shape like that of the resin molding 10 shown in FIG. 16 is fitted in the curved recess 24 of the other one of the pair of resin moldings 10.

The electromagnetic shielding textile sheets 11 included in the resin moldings 10 shown in FIGS. 15 and 16 are elastic nets having a longitudinal elongation in the range of 100 to 200% and a lateral elongation in the range of 100 to 400%.

The resin molding 10 shown in FIG. 15 is 100 mm×150 mm×20 mm in external dimensions, and the rib 20 thereof has a height of 3 mm and a width of 1 mm. The electromagnetic shielding textile sheet 11 cut beforehand in a size of 150 mm x 250 mm is placed in a cavity defined by a male mold 3 and a female mold 2 mounted on a molding machine (J350EPU, 350 t in mold clamping ability, commercially available from Nippon Seikosho K.K.). One end part of the electromagnetic shielding textile sheet 11 is fixedly held between the male mold 3 and a stripper 8, and the other end part of the same is left free.

In this state, a resin is injected into the cavity defined by the male mold 3 and the female mold 2 to form the injection-molded resin body 12. The electromagnetic shielding textile sheet 11 is stretched satisfactorily so as to extend over the entire area of a surface of the resin molding 10 of 20 mm in depth. Part of the resin forming the injection-molded resin body 12 flows through the meshes of the electromagnetic shielding textile sheet 11 to the outer surface of the electromagnetic shielding textile sheet 11, so that the rib 20 can surely be formed and the electromagnetic shielding textile sheet 11 and the injection-molded resin body 12 can firmly be bonded together.

A further modification of the present invention will be described with reference to FIG. 17. In the modification shown in FIG. 17, an electromagnetic shielding textile sheet 11 has meshes 16 defined by linear elements 15, and a resin forming an injection-molded resin body 12 penetrates halfway through the electromagnetic shielding textile sheet 11. The modification is substantially the same in other respects as the embodiment shown in FIG. 5.

Figure 17:
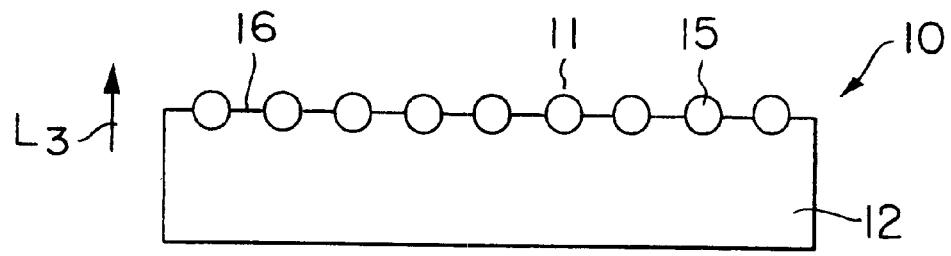
FIG. 17 is a view of a modification of the resin molding in accordance with the present invention.

As shown in FIG. 17, a resin molding of 100 mm×150 mm×20 mm has the injection-molded resin body 12 and the electromagnetic shielding textile sheet 11. The resin forming the injection-molded resin body 12 permeates the meshes 16 of the electromagnetic shielding textile sheet 11 in the direction $L_3$ of the thickness of the electromagnetic shielding textile sheet 11 by substantially half the thickness of the electromagnetic shielding textile sheet 11. Since the resin forming the injection-molded resin body 12 does not fully fill up the meshes 16, the electromagnetic shielding textile sheet 11 can easily be separated from the injection-molded resin body 12 when scrapping the resin molding 10.

The electromagnetic shielding textile sheet 11 shown in FIG. 17 the area of the meshes is 1 mm² or below. A molding machine of type J350EPU of 350 t in mold clamping ability commercially available from Nippon Seikosho K.K. is used.

A resin molding 10 in a further modification of the present invention will be described with reference to FIG. 18. The resin molding 10 shown in FIG. 18 has a pair of half parts 10a and 10b each having an electromagnetic shielding textile sheet 11 and an injection-molded resin body 12. The resin molding 10 shown in FIG. 18 is substantially the same in other respects as the embodiment shown in FIG. 5.

Figure 18:
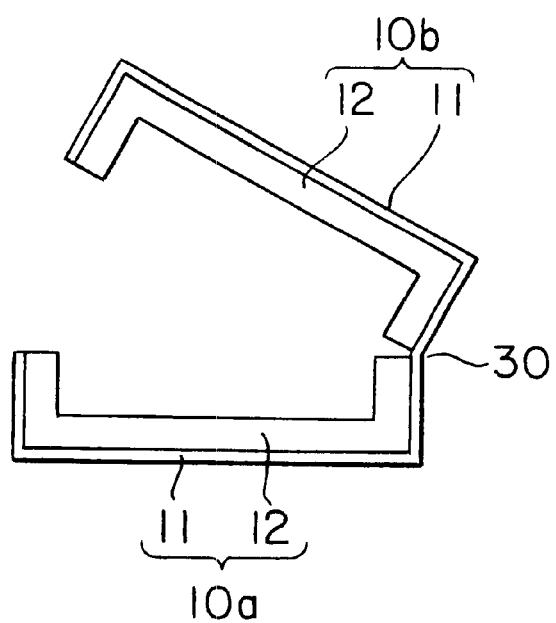
FIG. 18 is a view of a modification of the resin molding in accordance with the present invention.

Referring to FIG. 18, the half parts 10a and 10b are connected by a hinge 30. The hinge 30 is a part of the electromagnetic shielding textile sheet 11 serving as the components of both the half parts 10a and 10b.

A resin molding 10 in a further modification of the present invention will be described with reference to FIGS. 19 and 20. As shown in FIGS. 19 and 20, the resin molding 10 is a box 27 having corners 25. This resin molding 10 is substantially the same in other respects as the embodiment shown in FIG. 5.

As shown in FIGS. 20(a) and 20(b), the radius $R_1$ of curvature of the inner surface of the corner 25 of the box 27 is greater than the radius $R_2$ of curvature of the outer surface of the same. A doubled part of the electromagnetic shielding textile sheet 11 is positioned in the corner 25 (FIG. 20(a)). A rib 26 may be formed on the inner surface of the corner 25 to contain a doubled part of the electromagnetic shielding textile sheet 11.

According to the present invention, the soft meshed member can be shaped so as to conform the shape of a cavity formed between the male mold and the female mold when clamping together the make mold and the female mold. Therefore, it is not necessary to fabricate beforehand an insert member of a shape corresponding to the shape of the cavity of the mold. Since the resin body and the meshed member can firmly be locked together, it is not necessary to bond the resin body and the meshed member together with an adhesive or the like.

Third Embodiment

A third embodiment of the present invention will be described hereinafter with reference to the accompanying drawings.

FIGS. 21 to 24 are views of assistance in explaining a resin molding in accordance with the present invention and a method of manufacturing the resin molding. Referring to FIG. 22, a resin molding 10 has an injection-molded resin body 12, a decorative member 9 coating one of the surfaces of the injection-molded resin body 12 and provided with an opening 9a, and a soft electromagnetic shielding textile sheet 11 (meshed member) 11. The electromagnetic shielding textile sheet 11 is an insert member for electromagnetic shielding. The electromagnetic shielding textile sheet 11 is a meshed textile sheet formed by interlacing a plurality of linear elements 15 as shown in FIGS. 4(a) and 4(b).

Each linear element 15 is formed by coating a core member 15a of a synthetic resin, such as a polyester resin or a nylon resin, with a metal layer 15b. The metal layer 15b is formed by depositing copper or nickel on the surface of the core member 15a by electroless plating. The linear element 15 may comprise a glass core 15a and a metal layer 15b coating the glass core 15a or may be only a metal core.

The injection-molded resin body 12 may be formed of a general-purpose thermoplastic resin, such as a PC resin, a HIPS resin, a PS resin, a PP resin, a PE resin, an ABS resin, a PVC resin, a nylon resin or an AS resin.

The resin molding 10 having an excellent electromagnetic shielding characteristic and an excellent transparency can be formed by combining a transparent injection-molded resin body 12 and an electromagnetic shielding textile sheet 11 having a desired light transmittance.

A method of manufacturing the resin molding will be described below.

A mold 1 having a female mold 2 provided with a gate 2a, and a male mold 3 as shown in FIG. 21 is used. A cross-shaped, developed decorative member 9 is placed in the female mold 2 with an opening 9a formed therein coincided with the gate 2a. Air is sucked through suction passages 53 formed in the female mold 2 to attract the decorative member 9 to the inner surface of the female mold 2 by suction. An electromagnetic shielding textile sheet 11 is unwound from a feed roll 5 so as to extend through a cavity 7 defined by the female mold 2 and the male mold 3.

In this state, the electromagnetic shielding textile sheet 11 is extended through the cavity 7 of the mold 1 between the feed roll 5 and a take-up roll 6 in a slack state or in a moderately tensioned state which will not cause the electromagnetic shielding textile sheet 11 to break or will not obstruct a mold clamping operation when the female mold 2 and the male mold 3 are clamped together.

A stripper 8 is moved toward the male mold 3 to hold the electromagnetic shielding textile sheet 11 between the male mold 3 and the stripper 8.

Since the electromagnetic shielding textile sheet 11 extended in the cavity 7 is soft and is in a slack state or a moderately tensioned state, the electromagnetic shielding textile sheet 11 can be shaped so as to conform with the shape of the surface of the male mold 3. Thus, the electromagnetic shielding textile sheet 11 formed in a desired shape can be disposed at a predetermined position on the surface of the male mold 3.

The female mold 2 is moved toward the male mold, and the female mold 2 and the male mold 3 are clamped together. In this state, the decorative member 9 is on the side of the female mold 2 (first side) in the cavity 7, and the electromagnetic shielding textile sheet 11 is on the side of the male mold 3 (second side) in the cavity 7. A resin for forming an injection-molded resin body 12 is injected through the gate 2a of the female mold 2 so as to flow through the opening 9a of the decorative member 9 into the cavity 7. The electromagnetic shielding textile sheet 11 is pressed against the male mold 3 and the decorative member 9 is pressed against the female mold 2 by the resin injected into the cavity 7.

Since the electromagnetic shielding textile sheet 11 is porous, the electromagnetic shielding textile sheet 11 has moderate irregularities in its surfaces. Accordingly, the irregularities of the electromagnetic shielding textile sheet 11 are embedded in the injection-molded resin body 12, so that the adhesion of the electromagnetic shielding textile sheet 11 to the injection-molded resin body 12 is improved.

The decorative member 9 may be provided with a heat-sealing layer on its surface to improve the adhesion of the same to the injection-molded resin body 12.

Thus, the resin molding 10 is molded in the cavity 7 of the mold 1. Then, a part of the electromagnetic shielding textile sheet 11 included in the resin molding 10 is cut off the electromagnetic shielding textile sheet 11 by a cutter, not shown, and a scrap of the electromagnetic shielding textile sheet 11 is taken up by the take-up roll 6.

The resin molding 10 capable of electromagnetic shielding can easily and simply be manufactured.

Although the resin molding 10 in this embodiment is provided with the electromagnetic shielding textile sheet 11 as the meshed member, a nonwoven fabric of synthetic resin fibers or a porous synthetic resin film may be used instead of the electromagnetic shielding textile sheet 11.

The electromagnetic shielding textile sheet 11 may be cut in a shape corresponding to that of the resin molding 10 before forming the resin molding 10 with a cutting tool mounted on the stripper 8 when the stripper 8 is pressed against the male mold 3 instead of cutting the same in such a shape after the resin molding 10 has been molded.

Examples of the embodiment shown in FIGS. 21 to 24 will be described hereinafter. Satisfactory resin moldings 10 were manufactured by the same method as those described in connection with the first and the second embodiment.

EXAMPLE 1

Decorative Member

In-mold label (PET/Ny/Al/HS of a shape shown in FIG. 24)

Resin

HIPS

Resin molding

Dimensions: 150 mm×100 mm×20 mm
Electromagnetic shielding textile sheet
Linear elements: 50 μm in diameter
Mesh: 100/in.

EXAMPLE 2

Decorative member
Sheet molding (PS sheet of 0.3 mm thick)
Vacuum-formed molding
Dimensions: 150 mm×100 mm×20 mm
Electromagnetic shielding textile sheet
Linear elements: 50 μm in diameter
Mesh: 100/in.

Modifications of the invention will be described hereinafter with reference to FIGS. 25 to 27

In a modification shown in FIGS. 25 and 26, a male mold 3 is provided with a gate 3a, and an electromagnetic shielding textile sheet 11 is provided with an opening 51. This modification is substantially the same in other respects as the embodiment shown in FIGS. 21 to 24.

Referring to FIGS. 25, 26(a) and 26(b), a decorative member 9, such as an in-mold label or a sheet molding, is placed in a female mold 2, and air is sucked through suction passages 53 to attract the decorative member 9 to the surface of the female mold 2 by suction. Subsequently, an electromagnetic shielding textile sheet 11 is fed so as to extend in a space between the male mold 3 and a stripper 8, and the male mold 3 and the female mold 2 are clamped together. Then, a resin for forming an injection-molded resin body 12 is injected through the gate 3a of the male mold 3 so as to flow through the opening 51 of the electromagnetic shielding textile sheet 11 into a cavity 7. The electromagnetic shielding textile sheet 11 is pressed against the male mold 3 and the decorative member 9 is pressed against the female mold 2. Thus, a resin molding 10 as shown in FIG. 25 is obtained.

The electromagnetic shielding textile sheet 11 shown in FIGS. 25, 26(a) and 26(b) need not necessarily be provided with the opening 51 if the meshes of the electromagnetic shielding textile sheet 11 are large. The decorative member 9 may be a decorative member other than an in-mold label or a sheet molding, such as a fabric or a transfer foil.

Figure 27:
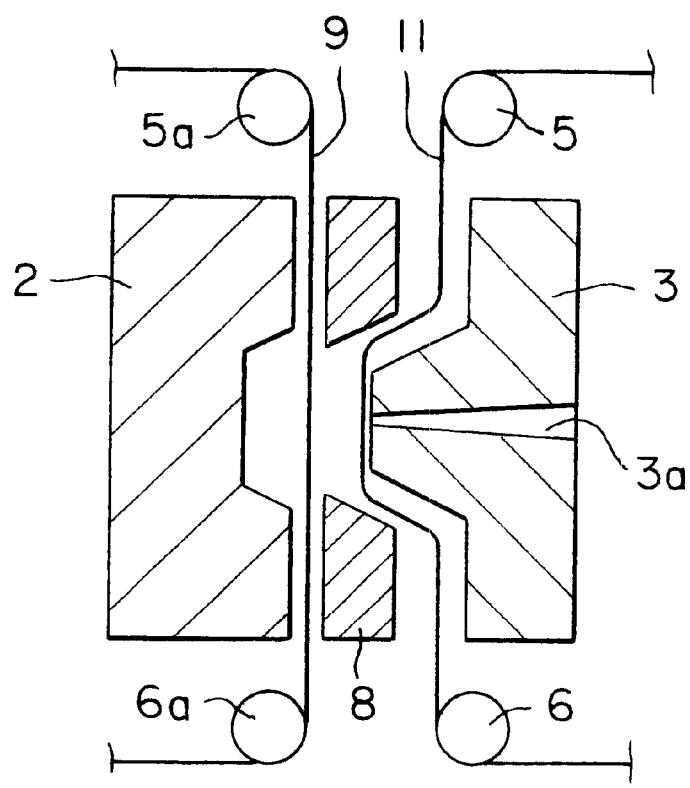
FIG. 27 is a modification of the resin molding manufacturing method in accordance with the present invention.

If the decorative member 9 is a fabric or a transfer foil, the decorative member 9 is fed from a feed roll 5a toward the female mold 2 and a scrap of the same is taken up by a take-up roll 6a as shown in FIG. 27.

A modifications of the present invention will be described with reference to FIGS. 28 to 30. In the modification shown in FIGS. 28 to 30, an electromagnetic shielding textile sheet 11 is held between a female mold 2 and a stripper 8, and a male mold 3 is provided with a gate 3a. This modification is substantially the same in other respects as the embodiment shown in FIGS. 21 to 24.

Figure 28:
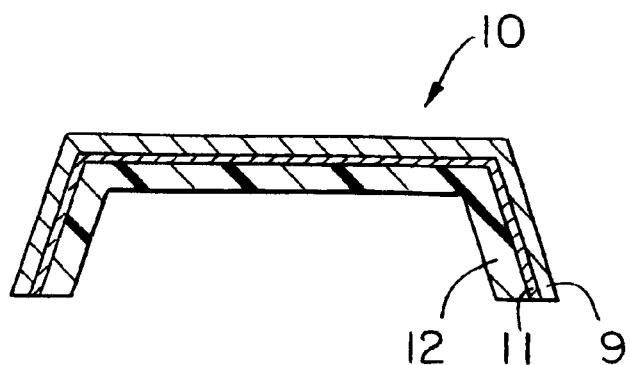
FIG. 28 is a view of another modification of the resin molding.
Figure 29:
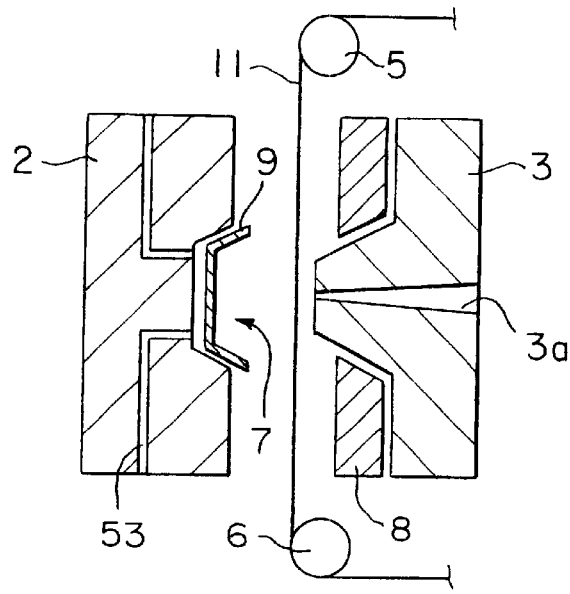
FIG. 29 is a view of further modification of a resin molding manufacturing method.
Figure 30:
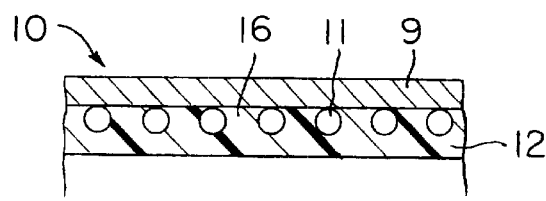
FIG. 30 is an enlarged fragmentary view of a resin molding shown in FIG. 28.

Referring to FIGS. 28 to 30, the female mold 2 and the male mold 3 are clamped together, and a resin for forming an injection-molded resin body 12 is injected through the gate 3a of the male mold 3 into a cavity 7 defined by the female mold 2 and the male mold 3. Consequently, the electromagnetic shielding textile sheet 11 is forced to move toward the female mold 2 (first side) and the electromagnetic shielding textile sheet 11 is superposed on a decorative member 9 held in place on the female mold 2 beforehand by suction produced by sucking air through suction passages 53.

The resin for forming the injection-molded resin body 12 flows through the meshes 16 of the electromagnetic shielding textile sheet 11, and reaches and adheres to the decorative member 9. A heat-sealing layer may be formed on a surface of the decorative member 9 or the decorative member 9 may be made of the same material as the resin for forming the injection-molded resin body 12 to improve the adhesion between the decorative member 9 and the injection-molded resin body 12.

Thus, a resin molding 10 having the decorative member 9 and the electromagnetic shielding textile sheet 11 superposed on one surface of the injection-molded resin body 12 as shown in FIGS. 28 and 29 is obtained. In this resin molding 10, the decorative member 9 forms the outer surface layer of the resin molding 10.

Examples of the embodiment shown in FIGS. 28 to 30 will be described below.

A satisfactory resin molding 10 was formed by using the following materials.

Decorative member
Construction: PET/Ny/Al/HS
Electromagnetic shielding textile sheet
Linear element: Polyester core coated with Cu and Ni by electroless plating and having a diameter of 50 μm
Mesh: 100/in.
Resin
HIPS A further modification of the present invention will be described with reference to FIGS. 31 and 32.

Figure 31:
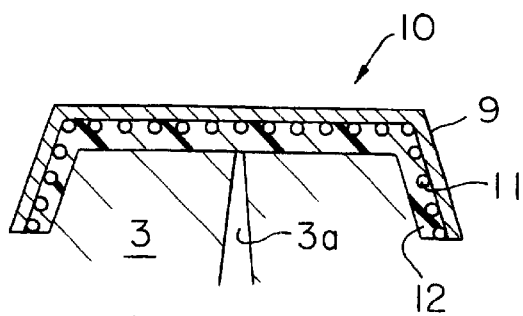
FIG. 31 is a view of a modification of the resin molding.
Figure 32:
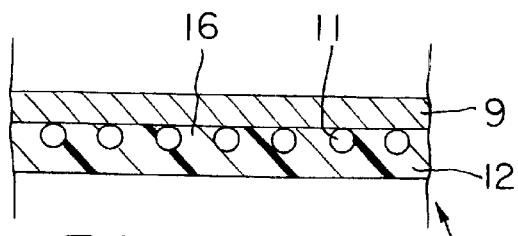
FIG. 32 is an enlarged fragmentary view of a resin molding shown in FIG. 31.

In the modification shown in FIGS. 31 and 32, a sheet formed by bonding together a decorative member 9 and an electromagnetic shielding textile sheet 11 is placed in a cavity 7. This modification is substantially the same in other respects as the modification shown in FIGS. 28 to 30.

In FIGS. 31 and 32, part of a resin forming an injection-molded resin body 12 flows into the meshes 16 of the electromagnetic shielding textile sheet 11 since the adhesion of the injection-molded resin body 12 to the electromagnetic shielding textile sheet 11 is thus improved and the decorative member 9 is bonded to the electromagnetic shielding textile sheet 11 beforehand, the resin molding 10 thus formed is strong.

A laminated structure formed by bonding together the decorative member 9 and the electromagnetic shielding textile sheet 11 may be formed in a desired sheet beforehand by pressure forming or vacuum forming.

An example of the modification shown in FIGS. 31 and 32 will be described below.

The following laminated sheets ① to ⑧ were formed.
① Decorative member (PET/Al/Ny)/Electromagnetic shielding textile sheet
② Decorative sheet (PET/Al/PC)/Electromagnetic shielding textile sheet
③ Decorative member (PET/Printed layer)/Electromagnetic shielding textile sheet
④ Decorative member (Ny/Printed layer)/Electromagnetic textile sheet
⑤ Decorative member (Al)/Electromagnetic shielding textile sheet
⑥ Decorative member (PET/Printed layer)/Electromagnetic shielding textile sheet/Ny
⑦ Decorative member (PET/Printed layer)/Electromagnetic shielding textile sheet/PC
⑧ Decorative member (PC/print)/Electromagnetic shielding textile sheet Satisfactory resin moldings 10 were obtained by combining injection-molded resin bodies 12 respectively provided with the foregoing laminated sheets each of the decorative member 9 and the electromagnetic shielding textile sheet 11 by injection molding.

The electromagnetic shielding textile sheets were nonwoven fabrics of PP fibers, PET fibers, PE fibers or Ny fibers, or meshed sheets formed by interlacing linear elements of a polyester resin, a nylon resin, a PP resin or an acrylic resin. The components of those electromagnetic shielding textile sheets may be plated with copper and nickel for electromagnetic shielding.

Each of the injection-molded resin bodies 12 was formed by molding a PC resin, an ABS resin, an AS resin, a HIPS resin a PP resin, a PET resin or a Ny resin. Since the electromagnetic shielding textile sheet is impregnated with the resin, the electromagnetic shielding textile sheet can be bonded to the injection-molded resin body even if the injection-molded resin body is formed of a not heat-sealable resin, such as a PPS resin, a PEEK resin, a PES resin or a polyacetal resin, and molded-in foil decoration is possible.

The resin molding provided with the decorative member and the soft meshed sheet can easily and surely be manufactured.

Fourth Embodiment

A fourth embodiment of the present invention will be described hereinafter with reference to the accompanying drawings.

Figure 33:
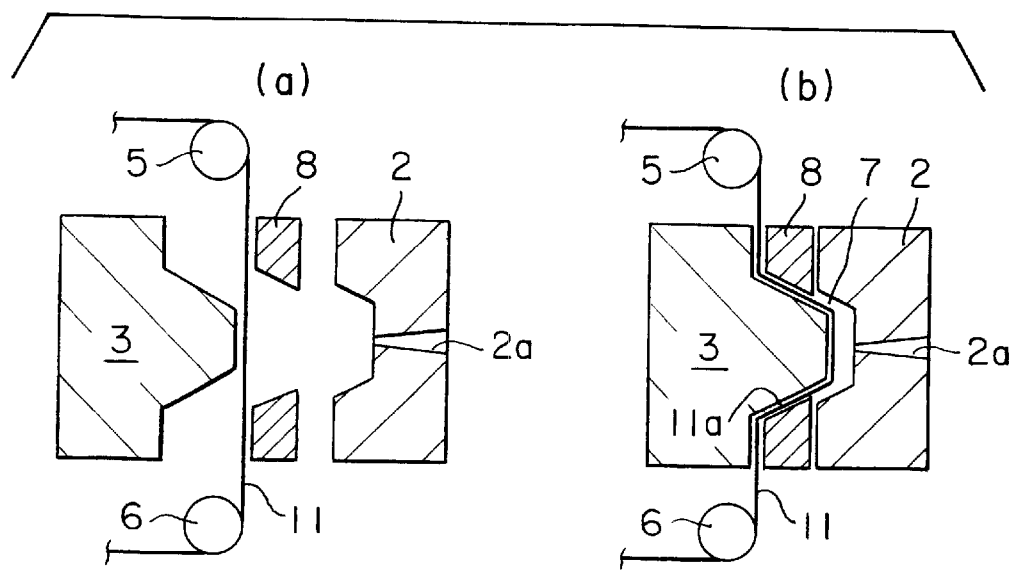
FIG. 33 is a sectional view of a resin molding manufacturing apparatus in a fourth embodiment according to the present invention.
Figure 34:
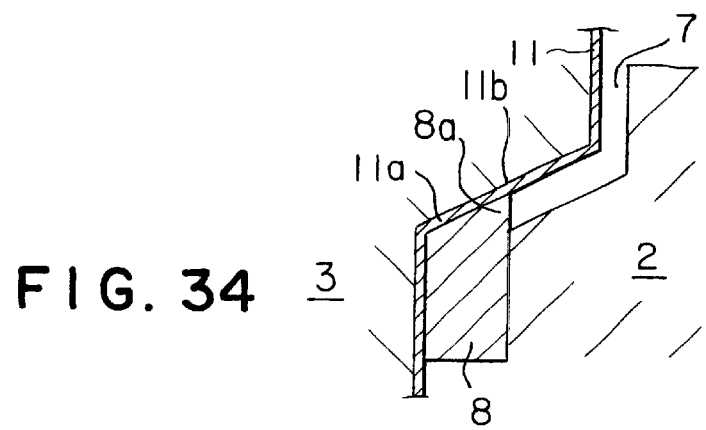
FIG. 34 is an enlarged fragmentary sectional view of a resin molding manufacturing apparatus in accordance with the present invention.
Figure 35:
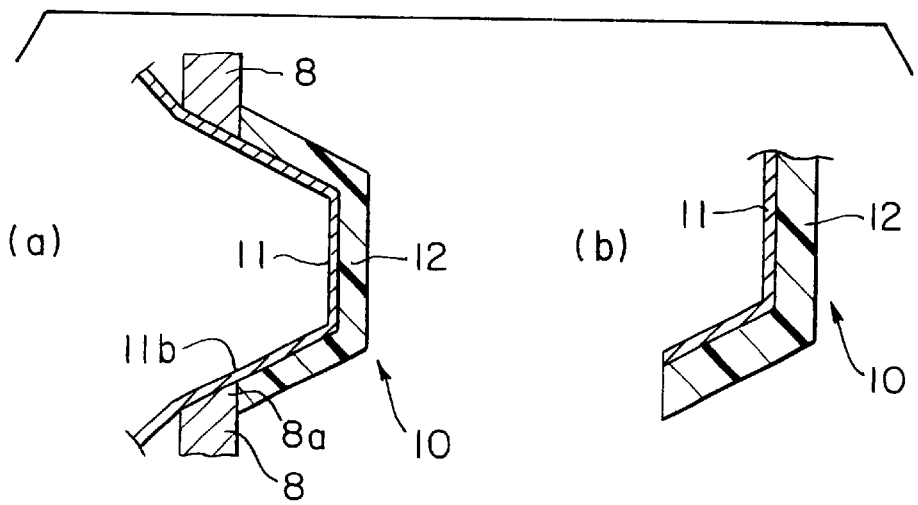
FIG. 35 is a view showing an injected resin injected by a resin molding manufacturing apparatus in accordance with the present invention.

FIGS. 33 to 35 are views of a resin molding manufacturing apparatus in accordance with the present invention.

First, a resin molding 10 will be described with reference to FIGS. 35(*a*) and 35(*b*). Referring to FIGS. 35(*a*) and 35(*b*), a resin molding 10 has an injection-molded resin body 12, and a soft electromagnetic shielding textile sheet (meshed sheet) 11 disposed on one surface of the injection-molded resin body 12. The electromagnetic shielding textile sheet 11 is an insert member capable of electromagnetic shielding. The meshed textile sheet shown in FIGS. 4(*a*) and 4(*b*) formed by interlacing a plurality of linear elements 15 is a concrete example of the electromagnetic shielding textile sheet 11.

Each linear element 15 is formed by coating a core member 15*a* of a synthetic resin, such as a polyester resin or a nylon resin, with a metal layer 15*b*. The metal layer 15*b* is formed by depositing copper or nickel on the surface of the core member 15*a* by electroless plating. The linear element 15 may comprise a glass core 15*a* and a metal layer 15*b* coating the glass core 15*a* or may be only a metal core.

The diameter of the linear elements 15 of the electromagnetic shielding textile sheet 11 is, for example, 50 μm and the mesh of the electromagnetic shielding textile sheet 11 is 100/in.

The injection-molded resin body 12 may be formed of a general-purpose thermoplastic resin, such as a PC resin, a HIPS resin, a PS resin, a PP resin, a PE resin, an ABS resin, a PVC resin, a nylon resin or an AS resin.

The resin molding 10 having an excellent electromagnetic shielding characteristic and an excellent transparency can be formed by combining a transparent injection-molded resin body 12 and an electromagnetic shielding textile sheet 11 having a desired light transmittance.

A resin molding manufacturing apparatus will be described hereinafter.

Referring to FIGS. 33 to 35, the resin molding manufacturing apparatus uses a male mold 3, and a female mold 2 provided with a gate 2*a*. A cavity 7 is defined by the male mold 3 and the female mold 2. The electromagnetic shielding textile sheet 11 is placed in the cavity 7.

FIGS. 33(*a*) and 33(*b*) are views of the resin molding manufacturing apparatus, FIG. 34 is an enlarged view of a part of the view shown in FIG. 33(*b*), FIG. 35(*a*) is a view of the resin molding manufacturing apparatus in a state after the completion of a resin injecting operation, and FIG. 35(*b*) is an enlarged view of a part of the view shown in FIG. 35(*a*).

A stripper 8 is interposed between the male mold 3 and the female mold 2 to hold a peripheral part 11*a* of the electromagnetic shielding textile sheet 11 lying on the brim of the cavity 7 between the stripper 8 and the male mold 3.

The stripper 8 has, in its end edge on the side of the cavity 7, a cutting part 8*a* for cutting the electromagnetic shielding textile sheet 11 in cooperation with the male mold 3. The resin molding manufacturing apparatus has a mold clamping ability of 300 t.

A method of manufacturing the resin molding will be described below. The female mold 2 and the male mold 3 are separated from each other and an electromagnetic shielding textile sheet 11 of 200 mm in width is unwound from a feed roll 5, and the electromagnetic shielding textile sheet 11 is extended through the cavity 7 (FIG. 33(*a*)).

In this state, the stripper 8 is spaced about 10 mm apart from the male mold 3, and the electromagnetic shielding textile sheet 11 is fed through a space between the male mold 3 and the stripper 8 into the cavity 7. The electromagnetic shielding textile sheet 11 is held in a moderately tensioned state between the feed roll 5 and a take-up roll 6.

Then, the stripper 8 is moved toward the male mold 3 to hold the electromagnetic shielding textile sheet 11 between the male mold 3 and the stripper 8 as shown in FIG. 33(*b*).

Since the electromagnetic shielding textile sheet 11 placed in the cavity 7 defined by the male mold 3 and the female mold 2 is soft and is held in a moderately tensioned state between the feed roll 5 and the take-up roll 6, the electromagnetic shielding textile sheet 11 can be shaped without being creased so as to conform with the shape of the surface of the male mold 3. Thus, the electromagnetic shielding textile sheet 11 shaped in a desired shape can be disposed at a predetermined position on the surface of the male mold 3.

In this state, a peripheral part 1a of the electromagnetic shielding textile sheet 11 positioned on the brim of the cavity 7 is held between the male mold 3 and the stripper 8. When the stripper 8 is thus moved toward the male mold 3 to hold the peripheral part 11*a* of the electromagnetic shielding textile sheet 11 positioned on the brim of the cavity 7 between the male mold 3 and the stripper 8, the cutting part 8*a* of the stripper 8 cuts the electromagnetic shielding textile sheet 11 along a part 11*b* thereof corresponding to the edge of the cavity 7 (FIG. 34)

Then, the male mold 3 and the female mold 2 are clamped together, and a resin is injected through the gate 2*a* of the female mold 2 into the cavity 7. Thus, an injection-molded resin body 12 is molded, and the electromagnetic shielding textile sheet 11 is bonded to the resin body 12 (FIGS. 35(*a*) and 35(*b*)).

Since the electromagnetic shielding textile sheet 11 is porous, the electromagnetic shielding textile sheet 11 has moderate irregularities in its surfaces. Accordingly, the irregularities of the electromagnetic shielding textile sheet 11 are embedded in the injection-molded resin body 12, so that the adhesion of the electromagnetic shielding textile sheet 11 to the injection-molded resin body 12 is improved.

Thus, a resin molding 10 of 150 mm×100 mm×20 mm in dimensions is formed in the cavity 7 of the mold 1. Then, the stripper 8 and the female mold 2 are separated from the male mold 3. The resin molding 10 is pushed out of the cavity 7 by the stripper 8. Subsequently, a scrap remaining after cutting out a part of the electromagnetic shielding textile sheet 11 in a shape corresponding to the resin molding 10 is taken up by the take-up roll 6.

Thus the resin molding 10 having an electromagnetic shielding property can easily and simply be manufactured. Since the electromagnetic shielding textile sheet 11 is firmly pressed against the male mold 3 by the stripper 8, any space will not be formed between the electromagnetic shielding textile sheet 11 and the male bold 3, and the electromagnetic shielding textile sheet 11 will neither be creased nor broken.

Although the resin molding 10 in this embodiment is provided with the electromagnetic shielding textile sheet 11 as the meshed sheet, a nonwoven fabric of synthetic resin fibers or a porous synthetic resin film may be used instead of the electromagnetic shielding textile sheet 11.

The part of the electromagnetic shielding textile sheet 11 included in the resin molding 10 may be cut along the part 11b out of the electromagnetic shielding textile sheet 11 after forming the resin molding 10 instead of cutting the same along the part 11b with the cutting part 8a after the resin molding 10 has been molded.

Modifications of the present invention will be described with reference to FIGS. 36(a), 36(b), 37(a) and 37(b).

An electromagnetic shielding textile sheet 11 may be placed on the surface of the male mold 3 as shown in FIGS. 36(a) and 36(b) instead of extending the electromagnetic shielding textile sheet 11 between the feed roll 5 and the take-up roll 6. FIG. 36(a) is a front elevation of the male mold 3 and the stripper 8, and FIG. 36(b) is a side elevation of the male mold 3 and the stripper 8. As shown in FIGS. 36(a) and 36(b), an electromagnetic shielding textile sheet 11 is pressed against the upper and the lower surfaces of the male mold 3 by bar magnets 59.

Since the bar magnets 59 press the electromagnetic shielding textile sheet 11 lightly, the electromagnetic shielding textile sheet 11 is able to slide along the surface of the male mold 3 when the stripper 8 is moved toward the male mold 3. Since a peripheral part of the electromagnetic shielding textile sheet 11 is pulled along the shape of the resin molding 10, the electromagnetic shielding textile sheet 11 is tensioned moderately.

If the resin molding 10 has four corners 60 as shown in FIGS. 37(a), 37(b) and 38, the stripper 8 may be provided with recesses 8b in parts corresponding to the corners 60 in it surface facing the male mold 3 to receive parts of the electromagnetic shielding textile sheet 11 (FIGS. 37(a) and 37(b)).

If the resin molding 10 has corners 60 as shown in FIGS. 37(a) and 37(b), it is possible that parts of the electromagnetic shielding textile sheet 11 corresponding to the corners 60 are folded and broken. The folded parts of the electromagnetic shielding textile sheet 11 can be received in the recesses 8b of the stripper 8 to prevent the breakage of the electromagnetic shielding textile sheet 11.

Thus the soft meshed sheet can surely be held in contact with the male mold. Therefore, any space will not be formed between the male mold and the meshed sheet and hence the meshed sheet will neither be creased or broken.

Fifth Embodiment

A fifth embodiment of the present invention will be described with reference to the accompanying drawings.

Figure 39:
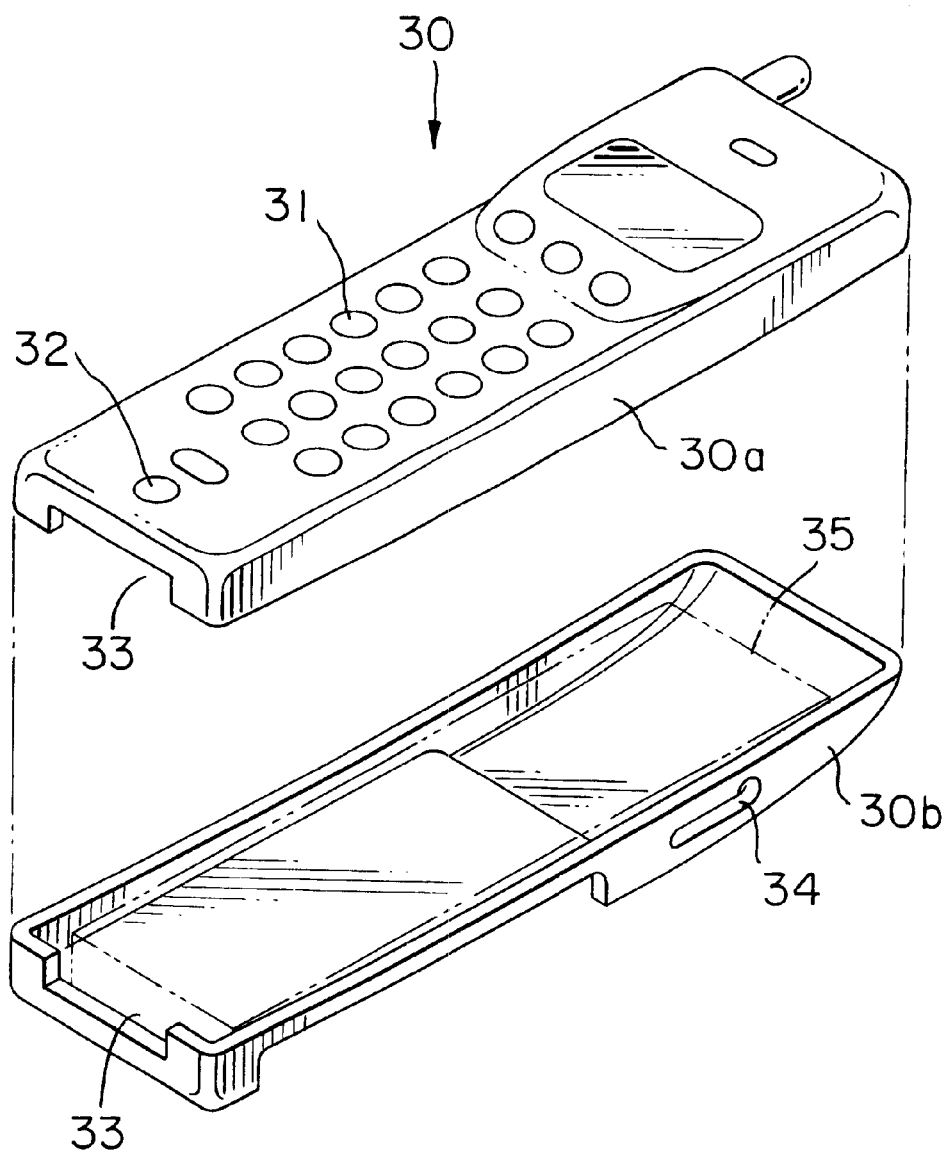
FIG. 39 is an exploded perspective view of a portable telephone case in a fifth embodiment according to the present invention.

As shown in FIG. 39, the fifth embodiment is a portable telephone case 30 formed by joining together a first half case 30a and a second half case 30b. An electronic circuit is contained in a space defined by the half cases 30a and 30b.

Push buttons 31 and a microphone 32 are attached to the first half case 30a. An earphone terminal 34 is attached to the second half case 30b. The half cases 30a and 30b are provided with recesses 33 to form a terminal operating opening.

Figure 40:
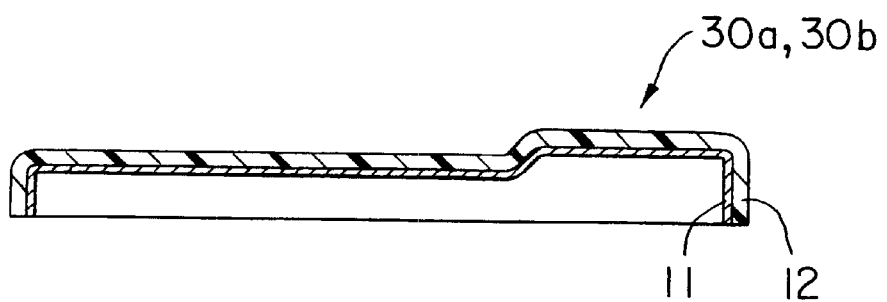
FIG. 40 is sectional view of a half case of the portable telephone.

As shown in FIG. 40, each of the half cases 30a and 30b has an injection-molded resin body 12 and a soft electromagnetic shielding textile sheet (meshed sheet) 11. The electromagnetic shielding textile sheet 11 is an insert member capable of electromagnetic shielding. The meshed textile sheet shown in FIGS. 4(a) and 4(b) formed by interlacing a plurality of linear elements 15 is a concrete example of the electromagnetic shielding textile sheet 11.

Each linear element 15 is formed by coating a core member 15a of a synthetic resin, such as a polyester resin, an acrylic resin or a nylon resin, with a metal layer 15b. The metal layer 15b is formed by depositing copper or nickel on the surface of the core member 15a by electroless plating. The linear element 15 may comprise a glass core 15a and a metal layer 15b coating the glass core 15a or may be only a metal core. The electromagnetic shielding textile sheet 11 may be a fabric or a nonwoven fabric.

The injection-molded resin body 12 may be formed of a general-purpose thermoplastic resin, such as a PC resin, a HIPS resin, a PS resin, a PP resin, a PE resin, an ABS resin, a PVC resin, a nylon resin or an AS resin.

The first and second half cases 30a, 30b having an excellent electromagnetic shielding characteristic and an excellent transparency can be formed by combining a transparent injection-molded resin body 12 and an electromagnetic shielding textile sheet 11 having a desired light transmittance.

A method of manufacturing the half cases 30a and 30b will e described below.

Figure 41:
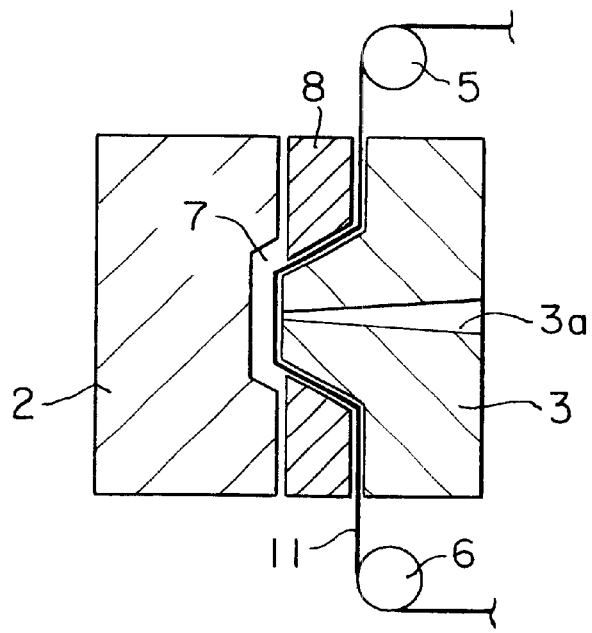
FIG. 41 is a view of assistance in explaining a method of manufacturing a half case.

Referring to FIG. 41, a mold having a female mold 2, and a male mold 3 provided with a gate 3a is used. The female mold 2 and the male mold 3 are separated from each other, an electromagnetic shielding textile sheet 11 is unwound from a feed roll 5, and the electromagnetic shielding textile sheet 11 is extended through a cavity 7 between the female mold 2 and the male mold 3.

The electromagnetic shielding textile sheet 11 extended through the cavity 7 is held in a slightly tensioned state between the feed roll 5 and a take-up roll 6.

As shown in FIG. 41, a stripper 8 is moved toward the male mold 3 to hold the electromagnetic shielding textile sheet 11 between the male mold 3 and the stripper 8.

Since the electromagnetic shielding textile sheet 11 extended through the cavity 7 is soft and is slightly tensioned, the electromagnetic shielding textile sheet 11 is formed in a shape corresponding to the shape of the surface of the male mold 3 without being creased. Thus, the electromagnetic shielding textile sheet 11 formed in a desired shape can be disposed at a predetermined position on the surface of the male mold 3.

The female mold 2 and the male e mold 3 are clamped together, then a resin is injected through the gate 3a of the male mold 3 so as to flow through the large meshes of the electromagnetic shielding textile sheet 11 into the cavity 7. Consequently, the electromagnetic shielding textile sheet 11 is pressed against the male mold 3 by the resin injected into the cavity 7.

Since the electromagnetic shielding textile sheet 11 is meshed, the electromagnetic shielding textile sheet 11 has moderate irregularities in its surfaces. Accordingly, the irregularities of the electromagnetic shielding textile sheet 11 are embedded in an injection-molded resin body 12, so that the adhesion of the electromagnetic shielding textile sheet 11 to the injection-molded resin body 12 is improved.

Thus, the half cases 30a and 30b are molded in the cavity 7 defined by the female mold 2 and the male mold 3. Then, a part of the electromagnetic shielding textile sheet 11 included in each of the half cases 30a and 30b is cut off the electromagnetic shielding textile sheet 11 by a cutter, not shown, and a scrap of the electromagnetic shielding textile sheet 11 is taken up by the take-up roll 6.

Thus, the half cases 30a and 30b having an electromagnetic shielding characteristic can easily and simply be manufactured.

Figure 42:
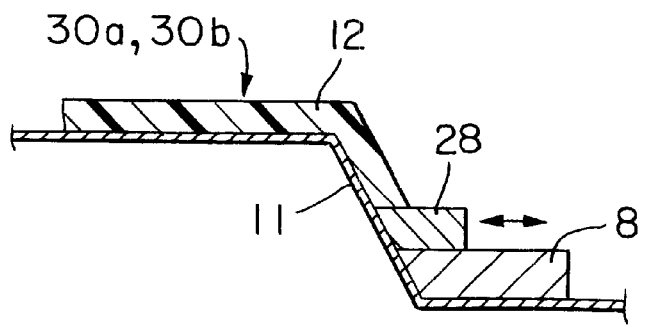
FIG. 42 is a view of a male mold, a female mold and a stripper.

In this embodiment, the parts of the electromagnetic shielding textile sheets 11 having the shape of the half cases 30a and 30b are cut out of the electromagnetic shielding textile sheets 11 after forming the half cases 30a and 30b. It is also possible to cut the electromagnetic shielding textile sheet 11 in a desired shape with a sliding cutter 28 slidably mounted on the stripper 8 as shown in FIG. 42, when the stripper 8 is pressed against the male mold 3.

A push button fitting structure for holding a push button 31 on the first half case 30a will be described below with reference to FIGS. 43 and 44. The injection-molded resin body 12 of the first half case 30a is provided with through holes 12a, and the electromagnetic shielding textile sheet 11 of the same is provided with through holes 51 respectively coinciding with the through holes 12a. The push button 31 is fitted in the through holes 12a and 51 as shown in FIG. 44.

The push buttons 31 are formed of a conductive elastomer. The push buttons 31 may be formed of an elastomer and a synthetic resin by a two-color molding method.

Figure 43:
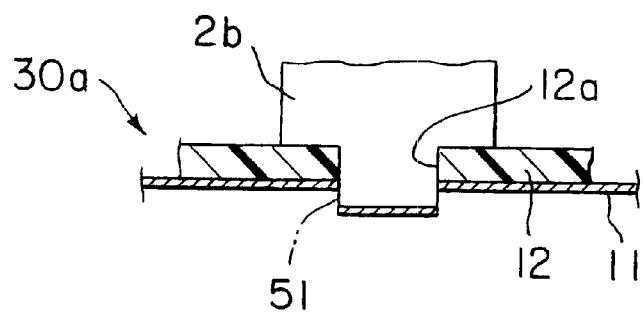
FIG. 43 is a view of assistance in explaining a method of fitting a push button on a half case.
Figure 44:
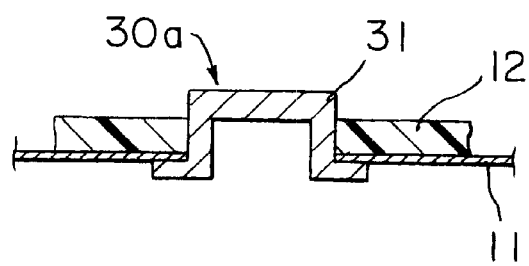
FIG. 44 is a view of a push button fitting structure.

The through holes 12a and the through hole 51 for receiving the push button 31 can be formed by a protrusible member 2b supported on the female mold 2 so as to be pressed against the male mold 3 when the female mold 2 and the male mold 3 are clamped together (FIG. 43).

If it is desired to mount a microphone 32 on the first half case 30a, a through hole 12a is formed only in a part of the injection-molded resin body 12 for the microphone 32 with another protrusible member 2b without forming any through hole in the electromagnetic shielding textile sheet 11.

Figure 45:
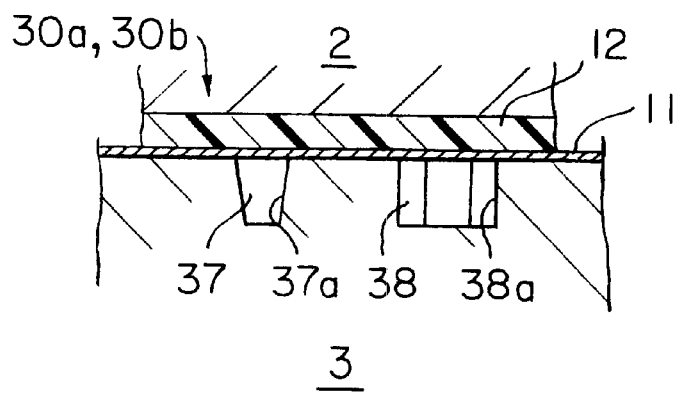
FIG. 45 is a view of a rib and a boss.

Each of the half cases 30a and 30b is provided on its inner surface with a plurality of ribs 37 and 38. The resin injected into the cavity 7 flows through the large meshes of the electromagnetic shielding textile sheet 11 into grooves 37a and 38a formed in the male mold 3 as shown in FIG. 45 to form the ribs 37 and 38.

The resin is able to flow through the electromagnetic shielding textile sheet 11 when the electromagnetic shielding textile sheet 11 is designed as follows.

Diameter of the linear elements: 50 to 300 μm

Area of meshes: 0.04 mm² or above

Opening ratio: 40% or above

The opening ratio is the ratio of the sum of the areas of the meshes to the total area of the electromagnetic shielding textile sheet 11.

An insulating structure for insulating an electric circuit 35 contained in a space defined by the half cases 30a and 30b from the electromagnetic shielding textile sheet 11 will be described with reference to FIGS. 46 to 49.

Figure 46:
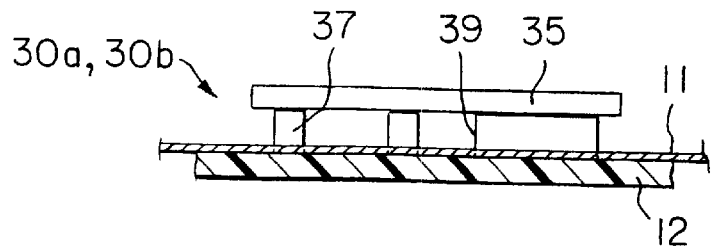
FIG. 46 is a view of an insulating structure insulating an electric circuit from an electromagnetic shielding textile sheet.

Referring to FIG. 46, the injection-molded resin body 12 is provided with ribs 37 and a seat 39 projecting through the electromagnetic shielding textile sheet 11. The electric circuit 35 may be isolated from the electromagnetic shielding textile sheet 11 by the ribs 37 and the seat 39.

Figure 47:
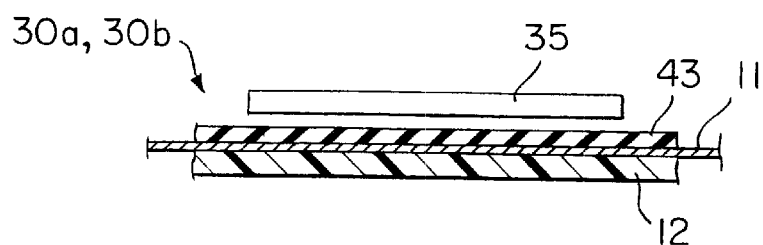
FIG. 47 is a view of an insulating structure insulating an electric circuit from an electromagnetic shielding textile sheet.

The electric circuit 35 may be isolated from the electromagnetic shielding textile sheet 11 by an insulating plate 43 interposed between the electric circuit 35 and the electromagnetic shielding textile sheet 11 as shown in FIG. 47.

Figure 48:
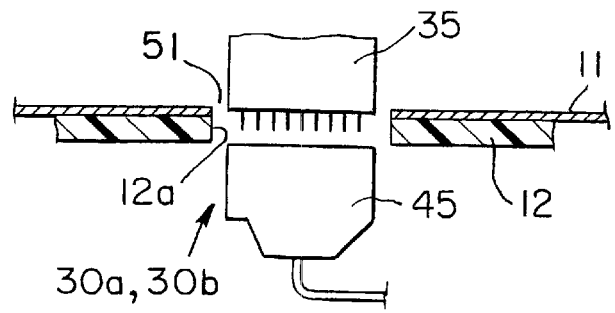
FIG. 48 is a view of an insulating structure for insulating an electric circuit from a connector.

Referring to FIG. 48, a through hole 12a is formed in the injection-molded resin body 12 and a through hole 51 is formed in the electromagnetic shielding textile sheet 11, and a connector 45 is inserted in an opening defined by the through holes 12a and 51. The through hole 51 is formed in a size greater than that of the through hole 12a in order that the edges of the electromagnetic shielding textile sheet 11 may not touch the connector 45.

Figure 49:
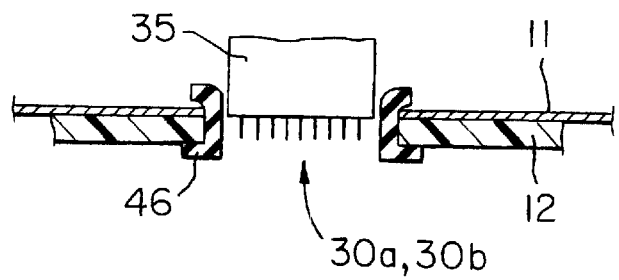
FIG. 49 is a view of an insulating structure for insulating an electric circuit from a connector.

An insulating ring 46 may be fitted on the respective brims of the through hole 12a of the injection-molded resin body 12 and the through hole 51 of the electromagnetic shielding textile sheet 11 as shown in FIG. 49 to prevent contact between the edges of the electromagnetic shielding textile sheet 11 and the connector 45.

The construction of the joint of the first half case 30a and the second half case 30b will be described with reference to FIGS. 50(a) to 50(c) and 51.

As shown in FIG. 50(a), edges of the injection-molded resin body 12 and the electromagnetic shielding textile sheet 11 exposed in the edges of the half cases 30a and 30b are flush with each other. When the half cases 30a and 30b are joined together, the respective electromagnetic shielding textile sheets 11 of the half cases 30a and 30b come into electrical contact with each other for the effective electromagnetic shielding at the joint of the half cases 30a and 30b.

Edge parts of the respective electromagnetic shielding textile sheets 11 may slightly be projected from the edges of the injection-molded resin bodies 12 corresponding to the edges of the half cases 30a and 30b as shown in FIG. 50(b) to achieve further reliable electrical contact between the respective electromagnetic shielding textile sheets 11 of the half cases 30a and 30b.

A conductive gasket 48 may be interposed between the half cases 30a and 30b as shown in FIG. 50(c) to improve the electromagnetic shielding characteristic of the joint of the half cases 30a and 30b. The conductive gasket 48 is fitted in a recess 49 formed in the edge of the first half case 30a.

The conductive gasket 48 may be such as formed by entirely covering a core 48a of polyurethane foam with a conductive sheet 48b or a conductive elastomer 48b (FIG. 51).

Figure 52:
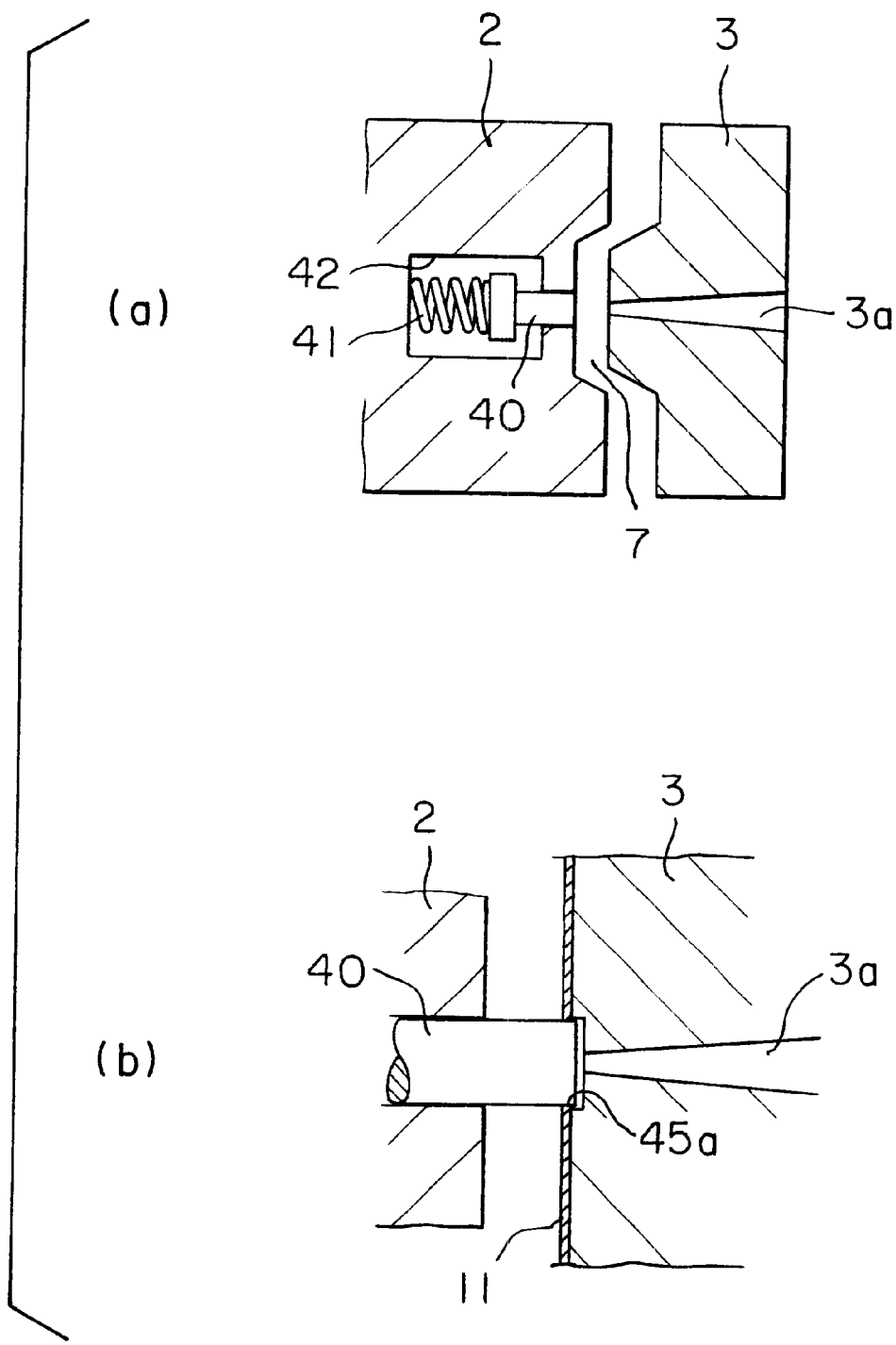
FIG. 52 is a view of a driving pin combined with a female mold.

The resin is injected through the gate 3a of the male mold 3 so as to flow through the large meshes of the electromagnetic shielding textile sheet 11 when molding the injection-molded resin body 12 (FIG. 41) in this embodiment. As shown in FIGS. 52(a) and 52(b), a drive pin 40 fitted in a recess 42 formed in the female mold 2 for sliding movement may be urged toward the male mold 3 by a spring 41. A hydraulic cylinder actuator or a pneumatic cylinder actuator may be used instead of the spring 41.

Referring to FIGS. 52(a) and 52(b), an opening 45 is formed in the electromagnetic shielding textile sheet 11 by the drive pin 40 pressed toward the male mold 3 when the female mold and the male mold 3 are clamped together. The resin injected through the gate 3a flows through the opening 45 into the cavity 7. Since the drive pin 40 is forced back into the recess 42 of the female mold 2 by the pressure of the resin forming the injection-molded resin body 12 and hence any recess corresponding to the drive pin 40 is not formed in the injection-molded resin molding 12.

Thus, the portable telephone case capable of reliable electromagnetic shielding can be manufactured. Since the method of manufacturing the portable telephone case does not need a process for plating the resin molding or attaching a shield tape to the same the method can be carried out by a short manufacturing process.

Sixth Embodiment

A sixth embodiment according to the present invention will be described with reference to FIGS. 53 to 56.

Referring to FIGS. 53(a) and 53(b), a case (resin molding) 60 for containing an electric circuit 65 is formed by joining together a first half case 60a and a second half case 60b. Each of the half cases 60a and 60b has an injection-molded resin body 12 and an electromagnetic shielding textile sheet (meshed sheet) 11 covering the inner surface of the injection-molded resin body 12. A recess 61 is formed in an inner half of an edge part of the first half case 60a, and a tongue (protrusion) 62 complementary to the recess 61 is formed in an inner half of an edge part of the second half case 60b.

The electromagnetic shielding textile sheet 11 of the first half case 60a covers the surface of the recess 61, and the electromagnetic shielding textile sheet 11 of the second half case 60b covers the surface of the tongue 62. Therefore, the respective electromagnetic shielding textile sheets 11 of the half cases 60a and 60b come into contact with each other when the half cases 60a and 60b are joined together with the tongue 62 of the second half case 60b fitted in the recess 61 of the first half case 60a to ensure perfect electromagnetic shielding.

When covering the surface of the tongue 62 of the second half case 60b with the electromagnetic shielding textile sheet 11, a peripheral part of the electromagnetic shielding textile sheet 11 is extended in an extension 64 beyond the edge of the tongue 62, and the extension 64 is wrapped around and bonded to the tongue 62 as illustrated in FIGS. 54(a) and 54(b). A peripheral part of the electromagnetic shielding textile sheet 11 may obliquely be extended from the inner surface of the second half case 60b toward the outer surface of the tongue 62 so as to cover the outer surface of the tongue 62 as shown in FIG. 55. The electromagnetic shielding textile sheet 11 has large meshes permitting the passage of the injected resin through the electromagnetic shielding textile sheet 11.

Modifications of the present invention will be described with reference to FIGS. 56(a) and 56(b). Referring to FIG. 56(a), an opening 68 formed in a case 80 containing an electric circuit 65 is covered with a cover (resin molding) 70. The cover 70 has a main part 70a covering the opening 68, and a flange (peripheral part) 70b extending from the peripheral edge of the main part 70a and in contact with the inner surface of the case 80.

As shown in FIG. 56(a), the main part 70a has an injection-molded resin body 12, an electromagnetic shielding textile sheet 11 covering the outer surface of the injection-molded resin body 12, and a decorative member 9 covering the outer surface of the electromagnetic shielding textile sheet 11. Respective peripheral parts of the electromagnetic shielding textile sheet 11 and the decorative member 9 of the main part 70a form the flange 70b. The flange 70b is fastened to the inner surface of the case 80 with electrically conductive screws 81. A conductive metal layer of a metal is formed by plating on the inner surface of the case 80, and the electromagnetic shielding textile sheet 11 is connected electrically to the conductive metal layer by the electrically conductive screws 81.

The electromagnetic shielding textile sheet 11 and the decorative member 9 may be extended on the inner surface of the injection-molded resin body 12 as shown in FIG. 56(b) instead of extending the same on the outer surface of the injection-molded resin body 12 as shown in FIG. 56(a).

In FIGS. 56(a) and 56(b), the injection-molded resin body 12 is formed of a general-purpose thermoplastic resin such as a PC resin, a HIPS resin a PS resin, a PP resin, a PE resin, an ABS resin, a PVC resin, a nylon resin or an AS resin.

The main part 70a having an excellent electromagnetic shield characteristic and an excellent transparency can be formed by combining a transparent injection-molded resin body 12 and an electromagnetic shield textile sheet 11 having a desired light transmittance.

The electromagnetic shielding textile sheet 11 is formed by interlacing linear elements of a polyester resin, a nylon resin or an acrylic resin coated with a metal layer formed by plating, or metal fibers. The decorative member 9 is formed of a PET resin, an AS resin, a PP resin, a PE resin, a PC resin a Ny resin or a PS resin. The main part 70a can be formed in a generally transparent structure by sandwiching the electromagnetic shielding textile sheet 11 between the injection-molded resin body 12 and the decorative member 9.

The cover 70 is a display panel of a portable telephone case and is capable of shielding the case 80 from electromagnetic radiation.

In FIGS. 56(a) and 56(b), the inner surface of the case is electrically connected through the screws 81 to the electromagnetic radiation shielding textile sheet 11 (FIG. 56(a)) or is directly and electrically connected to the electromagnetic shielding textile sheet 11 (FIG. 56(b)).

The flange 70b of the cover 70 may be fastened to the inner surface of the case 80 by a conductive adhesive tape instead of fastening the same to the inner surface of the case 80 with the screws 81.

What is claimed is:

1. A resin molding comprising:

an injection-molded resin body; and a soft meshed member bonded to the injection-molded resin body, said meshed member having a plurality of meshes, the resin forming the injection-molded resin body penetrating halfway through said meshed member so that said meshed member can be separated from said injection-molded resin body.

2. The resin molding according to claim 1, wherein the meshed member comprises an electromagnetic shielding textile sheet.

3. The resin molding according to claim 2, wherein the electromagnetic shielding textile sheet comprises at least two linear elements, each consisting of a core member and a metal layer covering the core member.

4. The resin molding according to claim 3, wherein the core members are made of a synthetic resin.

5. The resin molding according to claim 3, wherein the core members are made of glass.

6. The resin molding according to claim 2, wherein the electromagnetic shielding textile sheet comprises at least two linear elements, each having a metal core.

7. The resin molding according to claim 2, wherein the injection-molded resin body is transparent, the electromagnetic shielding textile sheet has a desired light transmittance, and the resin molding is substantially transparent.

8. The resin molding according to claim 1, wherein the meshed member comprises a nonwoven fabric of synthetic resin fibers.

9. The resin molding according to claim 1, wherein the meshed member comprises a synthetic resin film provided with a plurality of pores.

10. The resin molding according to claim 1, wherein the injection-molded resin body is provided with a through hole.

11. The resin molding according to claim 10, wherein the soft meshed member is provided with a through hole coinciding with the through hole of the injection-molded resin body.

12. The resin molding according to claim 10 wherein the soft meshed member comprises an electromagnetic radiation shielding textile sheet.

13. The resin molding according to claim 1, wherein the injection-molded resin body has a predetermined direction of a resin flow, and meshes of the meshed member are arranged in rows inclined to the direction of the resin flow.

14. The resin molding according to claim 1, wherein the meshed member has a plurality of meshes of an area of 0.04 mm$^2$ or above.

15. The resin molding according to claim 1, wherein the injection-molded resin body has a recess and a protrusion in surfaces thereof.

16. The resin molding according to claim 1, wherein the injection-molded resin body has a curved protrusion or a curved recess in surfaces thereof.

17. The resin molding according to claim 1 further comprising a decorative member bonded to the injection-molded resin body.

18. The resin molding according to claim 17, wherein the decorative member is on one side of the injection-molded resin body, and the soft meshed member is on the other side of the injection-molded resin body.

19. The resin molding according to claim 17, wherein the soft meshed member and the decorative member are laminated to one surface of the injection-molded resin body so that the decorative member is arranged outside the soft meshed member.

20. The resin molding according to claim 17, wherein the soft meshed member comprises an electromagnetic shielding textile sheet.

21. A resin molding comprising:

an injection-molded resin body; and a soft meshed member bonded to said injection-molded resin body, said injection-molded resin body comprising a pair of component parts connected by said meshed member serving as a hinge.

22. A resin molding comprising:

an injection-molded resin body; and a soft meshed member bonded to said injection-molded resin body, said injection-molded resin body having a boxed shape with corners and being provided with ribs to contain a portion of said meshed member on inner surfaces of said corners.

23. A resin molding comprising:

an injection-molded resin body; and a soft meshed member bonded to said injection-molded resin body, said injection-molded resin body having a boxed shape with corners, each corner having a curved inner surface and a curved outer surface, the radius of the inner surface being greater than the radius of the outer surface so that the corner can contain a portion of said meshed member.

* * * * *